(12) United States Patent
Lloyd et al.

(10) Patent No.: US 6,298,226 B1
(45) Date of Patent: Oct. 2, 2001

(54) RECEIVER FOR RF SIGNALS

(75) Inventors: Stephen L. Lloyd, Irvine; Pete Good, Dana Point, both of CA (US)

(73) Assignee: Conexant Systems, Inc., Newport Beach, CA (US)

( * ) Notice: Subject to any disclaimer, the term of this patent is extended or adjusted under 35 U.S.C. 154(b) by 0 days.

(21) Appl. No.: 09/203,001

(22) Filed: Nov. 30, 1998

(51) Int. Cl.[7] .................................................. H04B 1/10

(52) U.S. Cl. ......................... 455/296; 455/324; 455/334

(58) Field of Search ................................. 455/296, 303, 455/309, 371, 312, 323, 324, 334

(56) References Cited

U.S. PATENT DOCUMENTS

| | | | |
|---|---|---|---|
| 5,121,073 | * 6/1992 | Pijnenburg et al. | 455/312 |
| 5,422,889 | * 6/1995 | Sevenhans et al. | 455/324 |
| 5,584,059 | * 12/1996 | Turney et al. | 455/324 |
| 5,724,653 | * 3/1998 | Baker et al. | 455/312 |
| 5,748,681 | 5/1998 | Comino et al. . | |
| 5,918,167 | * 6/1999 | Tiller et al. | 455/324 |
| 5,999,802 | * 12/1999 | Aschwanden | 455/324 |

FOREIGN PATENT DOCUMENTS

| | | |
|---|---|---|
| 0 594 894 A1 | 5/1994 | (EP) . |
| WO 94/21043 | 9/1994 | (WO) . |
| WO 95/30275 | 11/1995 | (WO) . |

OTHER PUBLICATIONS

Copy of International Search Report dated Feb. 25, 2000 in corresponding PCT Application No. PCT/US99/27578.

Razavi, Behzad, RF Microelectronics; Prentice Hall Communications Engineering and Emerging Technologies Series, pp. 180–205 (1998).

Gray, Paul R. , et al., Analysis and Design of Analog Integrated Circuits, Third Edition, John Wiley & Sons, Inc., pp. 667–681 (1993).

Krauss, Herbert L., et al., Solid State Radio Engineering, John Wiley & Sons, Inc., pp. 188–218 (1980).

Antipolis, Sophia, European Telecommunications Standards Institute, Five Page Article Entitled: Digital Cellular Telecommunications System (Phase 2+ ): Radio Transmission and Reception (GSM 05.05) from GSM Technical Specification. Version 5.2.0., dated Jul. 1996.

Curran, Lawrence J., Supplement Editor, Three Page Article Entitled: RFICs: Dual–Band Cell Phones Emerge, from *EDN*, dated May 22, 1997.

Menezes, Bill, 1 Page Article Entitled: Study: Dual Mode Will Explode, from *Wireless Week*, dated Jun. 30, 1997.

(List continued on next page.)

*Primary Examiner*—Nay Maung
(74) *Attorney, Agent, or Firm*—Knobbe, Martens, Olson & Bear LLP

(57) ABSTRACT

A communications device includes a direct-conversion receiver for a radio frequency (RF) signal which is configured to receive the RF signal during defined time slots. A first input receives the RF signal and a first output outputs a baseband signal derived from the RF signal. A mixer module is configured to receive the RF signal and a local signal which is generated by a local oscillator. The mixer module generates an output signal which includes the baseband signal and an offset component. An amplifier module is connected between the first output and the mixer module, and includes a feedback loop which has in a backward path, a track-and-hold circuit. The track-and-hold circuit is configured to track the offset component during a first time slot and to hold a value of the offset component at an end of the first time slot until a subsequent second time slot begins. This held value is applied during the second time slot to the output signal in order to provide for fast compensation of the offset component.

27 Claims, 13 Drawing Sheets

OTHER PUBLICATIONS

Haynes, Tim, 2 Page Article Entitled: Track to Multi–band GSM, from Symbionics GSM Global System for Mobile Communications, (Undated).

6 Page Article Entitled: RF–122 Power Amplifier Controller for Heterojunction Bipolar Transistor Power Amplifiers, from Rockwell, Preliminary Data Sheet, dated Oct. 13, 1997.

Article Entitled: RF–123 Translation Loop, from Rockwell, Preliminary Data Sheet, dated Sep. 12, 1996, pp. 1–6.

Article Entitled: RF–130 Power Amplifier for GSM Applications, from Rockwell, Preliminary Data Sheet, dated Dec. 3, 1997, pp. 21–26.

Article Entitled: RF–133 RF/IF, Transceiver for GSM Application, from Rockwell, Preliminary Data Sheet, dated Oct. 31, 1997, pp. 1–15.

Article Entitled: RF–230 GSM 1800/PCS 1900 Power Amplifier, from Rockwell, Preliminary Data Sheet, dated Jan. 14, 1998, pp. 16–20.

* cited by examiner

RECEIVER FOR RF SIGNALS

FIELD OF THE INVENTION

The invention relates to a method and apparatus for communicating information. More particularly, the invention relates to circuitry for the mixing and amplification of radio frequency signals.

BACKGROUND OF THE INVENTION

A receiver for a radio frequency signal is configurable to operate in various applications. For example, the receiver can be used in TV receivers or in receivers used in a radio communications system. The receivers in such radio communications systems are usually included in wireless phones and in transceiver stations. An exemplary radio communications system is a cellular system that is in accordance with a particular specification, such as "Global System for Mobile Communications" (GSM), "Advanced Mobile Phone System" (AMPS) or "Code Division Multiple Access" (CDMA).

An example of an RF receiver is a direct-conversion receiver in which the local signal has a frequency that is set to be the same as the frequency of the RF signal. In such a direct-conversion receiver, the intermediate frequency is zero and the mixer transforms the RF signal into the baseband.

The transformed signal in the baseband has typically a low power level and requires subsequent amplification. Thus, the direct-conversion receiver has a high gain for the signal in the baseband. Because of this high gain, any component of the baseband that is slightly offset from the frequency zero becomes critical for a satisfying operation of the direct-conversion receiver. Any component of the baseband which is offset at a frequency zero is subsequently generally referred to as "DC offset." For instance, the DC offset may cause the direct-conversion receiver to become overloaded because the DC offset is also subject to the high gain and a final amplifier is driven into saturation. The DC offset may be caused by a mismatch of internal receiver components or frequency components that mix and produce products that fall into the baseband.

A direct-conversion receiver in a radio communication system is configured to have a varying gain in order to track the varying signal strength of the received RF signal. Because of this varying gain, the magnitude of the DC offset at the output of the mixer is constantly changing. Moreover, the varying gain complicates conventional methods to compensate for or cancel the DC offset. The faster the DC offset can be compensated or canceled, the sooner a cellular phone can receive good data. Particularly for radio communications systems that operate in time division duplex (TDD), the faster the DC offset can be corrected, the higher the TDD transmission rate. A high TDD transmission rate is desired, for example, because a high TDD rate improves voice quality in cellular phones by reducing the delay or echo that is typically canceled.

SUMMARY OF THE INVENTION

There is, therefore, a need to provide a circuitry that reduces the time to correct for DC offsets, particularly in direct-conversion receivers.

One aspect of the invention involves a hand-held communications device. The device includes a direct-conversion receiver for a radio frequency (RF) signal which is configured to receive the RF signal during time slots for reception defined in a TDD system. A first input receives the RF signal and a first output outputs a baseband signal derived from the RF signal. A mixer module is configured to receive the RF signal and a local signal which is generated by a local oscillator. The mixer module generates an output signal which includes the baseband signal and an offset component. An amplifier module is connected between the first output and the mixer module, and includes a feedback loop which has in a backward path a track-and-hold circuit. The track-and-hold circuit is configured to track the offset component during a first time slot for reception and to hold a value of the offset component at an end of the first time slot until a subsequent second time slot for reception begins. This held value is applied during the second time slot to the output signal in order to provide for fast compensation of the offset component.

Another aspect of the invention involves an electrical circuit. The circuit has a first input for receiving a communications signal comprising a baseband and an offset component, and a first output configured to output the baseband signal derived from the communications signal. An amplifier module is interconnected between the first input and the first output. The amplifier module comprises a feedback loop which includes a track-and-hold circuit within a backward path. The track-and-hold circuit is configured to track the offset component during a first period of time and to hold a value of the offset component at an end of the first period of time until a subsequent second period of time begins. The held value is applied during the second period of time to the communications signal in order to provide for fast compensation of the offset component.

Another aspect of the invention relates to an electrical circuit. The electrical circuit comprises a first input for receiving a communications signal comprising a baseband and an offset component. The electrical circuit also comprises an amplifier module which is in communication with the first input. The amplifier module comprises a feedback loop with a track-and-hold circuit. The track-and-hold circuit is configured to hold a compensation value and to compensate the offset component based on the compensation value.

In another embodiment, the track-and-hold circuit comprises a first amplifier stage having a second input which is configured to receive a signal derived from the baseband signal. A second amplifier stage has a third input and a capacitor is interposed between the first and second amplifier stages.

In yet another embodiment, the first amplifier stage includes a first subcircuit and a second subcircuit connected in parallel to the capacitor and the second input. The first subcircuit is configured to linearly modify a charge of the capacitor based on the value representing the offset component. The second subcircuit is configured to non-linearly modify the charge of the capacitor based on the value of the offset component.

In another embodiment, the first amplifier stage further comprises a third subcircuit which is connected to the capacitor. The third subcircuit is configured to modify a common-mode voltage of the capacitor.

Another aspect of the invention relates to a method for compensating an offset component. The method comprises the act of receiving a communications signal comprising a baseband and an offset component, holding in a feedback path during at least a first time period, a compensation value, and compensating during at least a second time period, the offset component based on the compensation value.

In another embodiment, the method further comprises the act of linearly modifying the compensation value during the first time period. In yet another embodiment, the method further comprises the act of non-linearly modifying the compensation value during the first time period. In still another embodiment, the act of holding modifies a common-mode voltage of a capacitor existing in the feedback path.

Another aspect of the invention relates to an electrical circuit. The electrical circuit comprises a first input for receiving a communications signal comprising a baseband and an offset component and an amplifier module. The amplifier module is in communication with the first input and comprises a feedback loop, a track-and-hold circuit and a compensation circuit.

The track-and-hold circuit is in communication with said feedback loop. The track-and-hold circuit has at least one capacitance which stores a voltage related to the offset component. The track-and-hold circuit is further configured to output a compensation drive signal. The compensation circuit compensates the offset component by combining the offset component with the first drive signal.

In one embodiment, the feedback path further comprises a drive circuit which generates a first drive signal. The first drive signal is configured to modify the voltage stored on the capacitance. In another embodiment, the drive circuit is further configured to generate a second drive signal when the offset component exceeds a predetermined threshold value. In still another embodiment, the first and second drive signals modify the voltage stored on the capacitance, and the second drive current is higher than the first drive current.

Another aspect of the invention relates to a method for compensating an offset component of a baseband signal. The method comprises the acts of receiving a baseband signal with an offset component, coupling the baseband signal to a feedback path, generating a first drive signal to modify a voltage across a capacitor in the feedback path, the drive signal and the voltage across the capacitor being substantially dependent on the offset component, generating a compensation signal which is based on the voltage across the capacitor, and combining the compensation signal with the baseband signal to substantially compensate the offset component.

In one embodiment, the method further comprises the act of generating a second drive signal when the offset component has a value which is above a predetermined threshold value. In another embodiment, the first and second drive signals are drive currents which modify the charge of the capacitor, and the second drive current is higher than the first drive current.

BRIEF DESCRIPTION OF THE DRAWINGS

These and other aspects, advantages, and novel features of the invention will become apparent upon reading the following detailed description and upon reference to the accompanying drawings.

DETAILED DESCRIPTION

An embodiment of the present circuitry is described with reference, but not limited to, a radio communications system. The circuitry comprises an amplifier circuit and a mixer, and is part of a radio frequency (RF) receiver located, for example, in a wireless phone or a transceiver station. It is contemplated that the circuitry can be used in any system which requires amplification and mixing of radio frequency signals in accordance with predefined requirements. For instance, such applications include cellular phones for GSM or CDMA, digital spread spectrum (DSS) cordless phones, direct sequence spread spectrum systems, frequency hoping spread spectrum systems, wireless local area networks (LANs), wireless modems, wireless security systems and inventory control systems.

One of the predefined requirements relates to a time required to compensate the receiver for a DC offset output from the mixer. Hereinafter, this time is referred to as a settling time of the receiver and is used as an exemplary parameter for evaluating the performance of the receiver. Generally, the settling time should be as short as possible. In one embodiment, the circuitry is part of an RF receiver for a wireless (cordless) phone (e.g., a cellular phone), which is configured for use in a time division duplex (TDD) system. As it is known in the art, in a TDD system transmission and reception of RF signals occur alternating in adjacent time slots. That is, the phone transmits during a transmit time slot, and receives during a receive time slot, wherein the time slots for transmission and reception alter. Those skilled in the art will appreciate that the circuitry can also be located in a base transceiver station (BTS) for a phone system using TDD transmission. The following description of an embodiment of the circuitry and its application are referenced to the particulars of a wireless phone system using TDD transmission, and wireless phones used therein. Hereinafter, the wireless phone 3 is referred to as phone 3.

Figure 1:
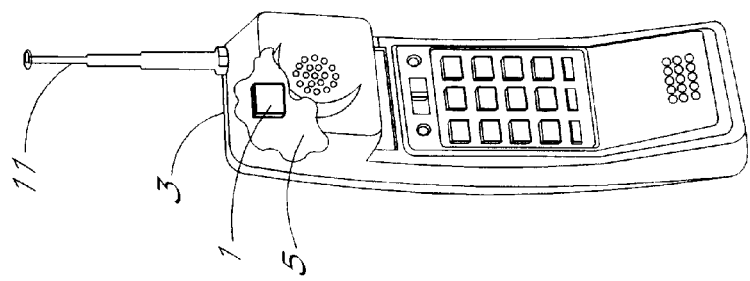
FIG. 1 is a schematic illustration of a wireless phone.

FIG. 1 schematically illustrates a phone 3 including an antenna 11, a display and a keypad. A portion of the case of the phone 3 is cut away to show a motherboard 5 of the phone 3 with an integrated circuit 1 which includes an RF receiver, or a portion thereof, as described below. The integrated circuit 1 is hereinafter generally referred to as the RF receiver. Although not shown in FIG. 1, those skilled in the art will appreciate that the phone 3 comprises a central processor unit (CPU) and plurality of other components and functional modules.

Figure 2:
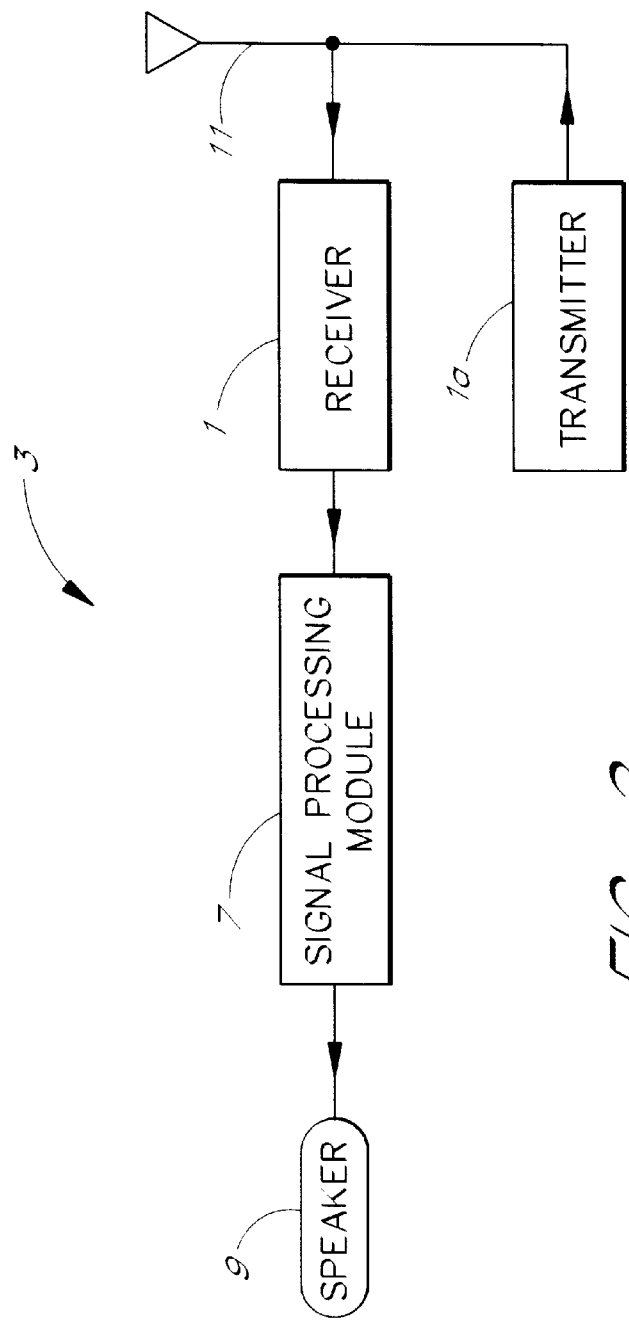
FIG. 2 is a schematic illustration of a receive path, for example, of a wireless phone.

FIG. 2 shows an schematic illustration of a receive path of the phone 3. In the shown conceptional embodiment, the receive path comprises the antenna 11, an RF receiver 1 (hereinafter referred to as receiver), a signal processing module 7 and a speaker 9. The receiver 1 is interconnected between the antenna 11 and the signal processing module 7 which is connected to the speaker 9. The phone 3 further includes a transmit path which is indicated in FIG. 2 by means of a transmitter 1a which is connected to the antenna 11. The RF receiver 1 typically includes several groups of amplifiers separated by frequency-changing circuits (e.g., mixers) to extract information carried by a weak signal voltage that appears at terminals of the antenna 11. The receiver 1 outputs a baseband signal which is input to the signal processing module 7 for further processing.

Figure 3:
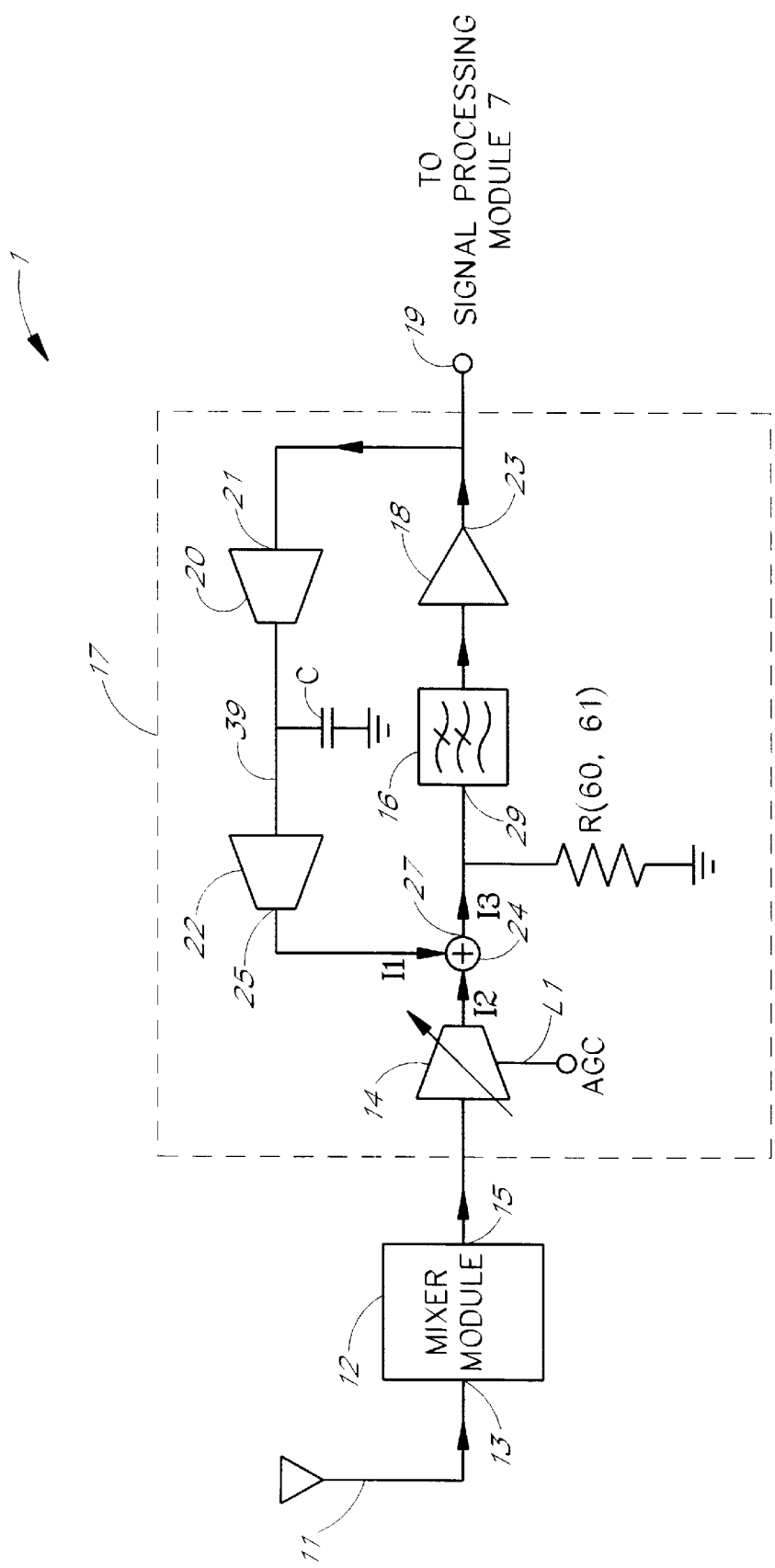
FIG. 3 is a schematic illustration of a receiver included in the receive path shown in FIG. 2.

FIG. 3 shows a schematic illustration of the receiver 1. In this schematic illustration, the receiver 1 includes a mixer module 12 and an amplifier module 17. The mixer module 12 has an input 13 and an output 15 to connect the mixer module 12 to the antenna 11 and the amplifier module 17. The amplifier module 17 has an output 19 which is connectable to the signal processing module 7. The amplifier module 17 includes components which are arranged in a forward path and a feedback path. The feedback path and a part of the forward path form a feedback loop.

The forward path includes an amplifier 14, a low-pass filter 16 and an amplifier 18 which are serially arranged so that a signal from the amplifier 14 is filtered by the low-pass filter 16 and amplified by the amplifier 18. The amplifier 18 is connected to the output 19 and has a gain of about 40 dB. The amplifier 14 is connected to a control line L1 to receive an automatic gain control signal (AGC) from a central controller (not shown) of the phone 3. The control signal controls the amplifier 14 to amplify a signal with a desired gain. The amplifier 14 is operable at a gain between 20 dB and −40 dB.

The feedback path includes two amplifiers 20, 22 and a grounded capacitor C which is interposed between the amplifier 20 and the amplifier 22. An input 21 of the amplifier 20 is associated with an output 23 of the amplifier 18, and an output 25 of the amplifier 22 is connected to a summation point, indicated as an adder 24, between the amplifier 14 and the low-pass filter 16. The amplifier 20 has an output 39 to which the capacitor C is connected. The adder 24 has an output 27 which is connected to a grounded resistor R (resistors 60, 61 in FIG. 9) and a port 29 of the low-pass filter 16. The adder 24 sums outputs from the amplifier 14 and the amplifier 22 and generates a summation signal which is output at the output 27. In the illustrated embodiment, the output from the amplifier 22 is a current I1 and the output from the amplifier 14 is a current I2 so that the summation signal is a current I3. Further details of the amplifier module 17 are shown in FIGS. 5–9.

The amplifiers 20, 22 and the capacitor C implement a track-and-hold circuit which tracks a variable DC offset during a receive time slot. The track-and-hold circuit holds the DC offset during a transmit time slot in which the receiver 1 is inactive. This DC offset is referred to as a compensation value. When the next receive time slot begins, the compensation value from the previous time slot is still "stored" in the capacitor C of the feedback path and immediately available at the adder 24. The stored compensation value is then used to compensate for a DC offset during the present time slot. Advantageously, this minimizes the settling time of the receiver 1.

The receiver 1 is preferably implemented as an integrated circuit configured to operate at a voltage between 2.7 volts and 5 volts which is typically provided by a re-chargeable battery. It is contemplated that not all components of the receiver 1 are necessarily integrated in the integrated circuit. For instance, the capacitor C is in one embodiment an external capacitor. This allows to easily modify the characteristics of the receiver 1 by replacing the capacitor C with another capacitor of a different capacity. Further, it is contemplated that FIG. 3 shows the principal structure of the receiver 1. That is, a specific implementation of an integrated circuit may not have discrete and isolated components such as the amplifiers 20, 22 and the amplifiers 14, 18. For instance, the amplifier 22 and the adder 24 may be encompassed by the amplifier 14. Similarly, in a specific embodiment the feedback path may originate within the amplifier 18 and not directly at the output 23 as shown in FIG. 3.

Furthermore, FIG. 3 shows the receiver 1 in a single-ended embodiment with the capacitor C connected to ground. In another embodiment, the capacitor is connected between two differential lines which are typically referred to as "positive" and "negative", or "+" and "−." FIGS. 5–9 show receiver components in the differential implementation.

The amplifier 22 is shown as a transconductance stage because the output current I1 sums with the current I2 from the amplifier 14 into the same load resistance R. In one embodiment, the resistor R has a value of about 4 kiloohms. Correspondingly, the combination of the amplifier 22 and the resistor R can be considered as a voltage amplifier with a gain factor of about 0.75. The capacitor C is selected to provide unit gain in the feedback loop for a desired frequency. In one embodiment, the capacitor C has a value of about 68 nanofarads (nF) which provides a unity gain frequency of about 20 kHz and, thus, a loop bandwidth of about 20 kHz. Alternatively, the capacitor has a value of about 100 nF which provides a unity gain frequency of about 14.5 kHz (bandwidth of about 14.5 kHz).

Figure 4:
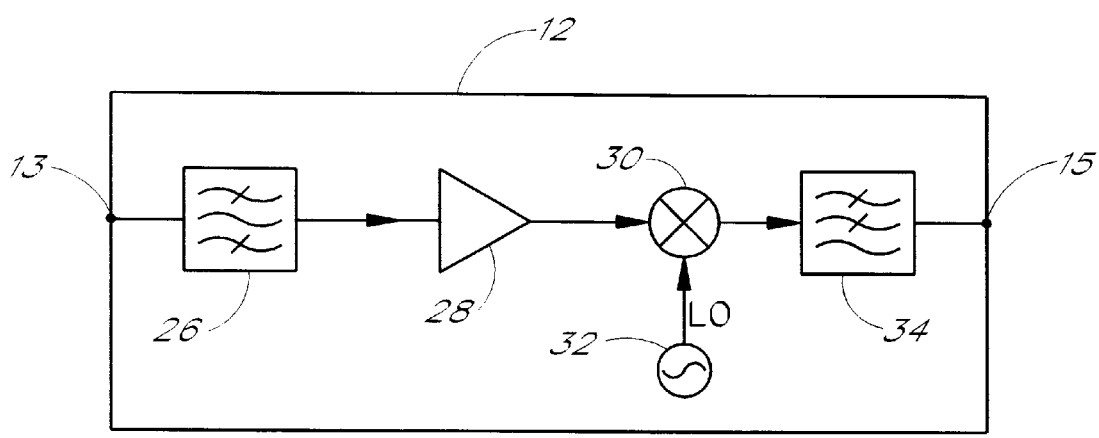
FIG. 4 is a schematic illustration of a mixer module included in the receiver.

Focusing on the single-ended implementation, FIG. 4 shows a schematic illustration of the mixer module 12 of the receiver 1. Generally, a receiver for a radio frequency signal usually comprises a combination of an amplifier and a mixer for signal amplification and frequency conversion. The amplifier, usually a low-noise amplifier (LNA), receives the RF signal, amplifies the RF signal and feeds the amplified RF signal to the mixer which in addition receives a local signal from a local oscillator (LO). The local oscillator signal is, for example, a sinusoidal signal having a constant amplitude and frequency. The mixer generates an output signal that comprises a desired frequency, but also includes undesired frequencies. The output signal is usually filtered to block the undesired frequencies.

In the illustrated embodiment, the mixer module 12 includes two filters 26, 34, an amplifier 28 and a mixer 30. The filter 26 is connected between the input 13 and the amplifier 28. As illustrated, the filter 26 is a bandpass filter which limits the bandwidth of the RF signal received from the antenna 11 to block undesired frequency components. In one embodiment, the passband is about 25 MHz to allow passage of a receive band between 900 MHz and 930 MHz, more precisely between 902 MHz and 928 MHz, and to block frequencies outside of this receive band. The band-limited RF signal is input to the amplifier 28 which is in one embodiment a low-noise amplifier (LNA). The mixer 30 receives the RF signal from the LNA 28 and a signal LO which is generated by a local oscillator 32 in a conventional manner.

In one embodiment, the signal LO has a frequency of about 900 MHz. An output of the mixer 30 is connected to the filter 34 which is a low-pass filter. The low-pass filter 34 has a cut-off frequency of about 600 kHz. Although FIG. 4 shows the local oscillator 32 as belonging to the mixer module 12, it is contemplated that the local oscillator 32 may be located outside the mixer module 12 and at other locations within the phone 3.

In an exemplary cellular phone system, the RF signal has a carrier frequency of approximately 900 MHz. The RF signal originates from a remote radio transmitter (base transceiver station) which modulates, for example, a 900 MHz signal with a data or voice signal. In this embodiment, the phone 3 is configured for a 900 MHz digital spread spectrum system.

The receiver 1 is a direct conversion receiver which is configured to receive RF signals in a frequency range between 900 MHz and 930 MHz, and to (down)convert these RF signals to the baseband. That is, the mixer 30 receives the approximately 900 MHz signal LO and the approximately 900 MHz RF signal and generates an output signal (baseband signal) having a frequency of ideally 0 Hz. The low-pass filter 34 is connected between the mixer 30 and the output 15. The low-pass filter 34 selects the desired baseband and blocks frequencies which are higher than a predetermined cut-off frequency of, for example, about 600 kHz. It is contemplated that other values for the cut-off frequency can chosen, as long as undesired frequencies are sufficiently blocked.

The signal LO generated by the local oscillator 32 can be a sinusoidal signal having a frequency between 500 MHz and 2.5 MHz. In one embodiment, the signal LO has a frequency between 903 MHz and 927 MHz. Other phone systems operate, for example, at carrier frequencies of about 1800 MHz or 1900 MHz. Alternatively, the cellular phone can be a dual band cellular phone which can operate within one of two frequency bands, for example, 900 MHz or 1800 MHz. In a direct conversion receiver, the frequency of the signal LO is generally selected to generate an output signal in the baseband. The embodiment of the invention is hereinafter described with reference to a 900 MHz wireless phone system. However, it is contemplated that this embodiment of the invention is also applicable in cellular phone systems operating at other carrier frequencies such as 800 MHz, 1800 MHz or 1900 MHz.

Focusing on the differential embodiment, the mixer module 12 is modified to include a duplication of some components of the mixer module 12 shown in FIG. 4. When used in a cellular phone for a digital spread spectrum system, the receiver 1 is configured to provide complete RF-to-baseband I/Q demodulation and includes double-balanced quadrature mixers, one for the differential I signal and one for the differential Q signal. Hereinafter, the components (14, 22, 36, 38, 40) of the receiver 1 are described with reference to differential signals (I, Q). Those skilled in the art will appreciate that these components are configured correspondingly for the other differential signal.

Figure 5:
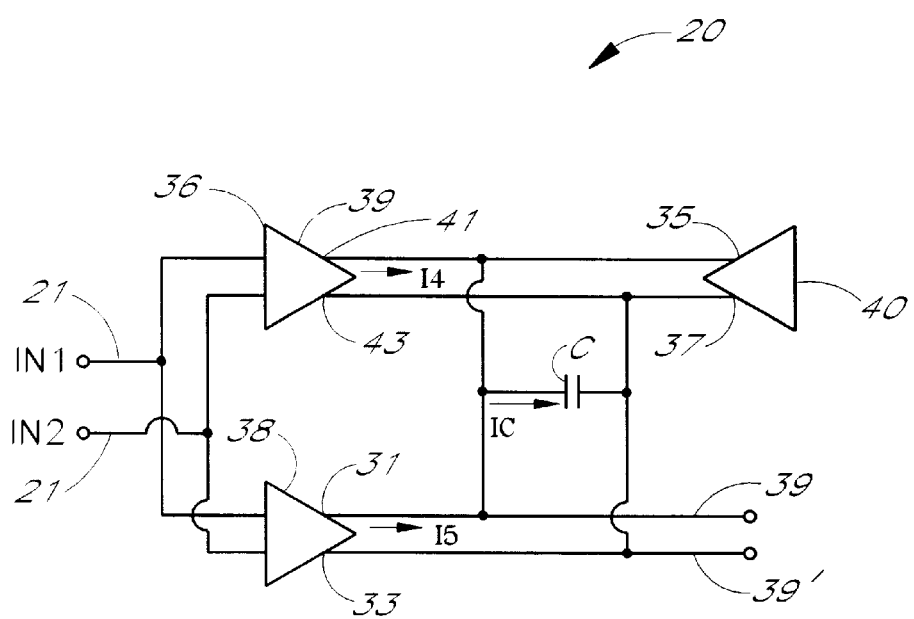
FIG. 5 is a schematic illustration of a feedback circuit.

FIG. 5 shows a schematic block diagram of the amplifier 20 in the differential embodiment for one of the differential signals (I, Q). As indicated in FIG. 3, the amplifier 20 has the input 21 for two differential input signals IN1, IN2, and the output 39. As FIG. 5 shows the amplifier 20 in the differential mode, the amplifier 20 has two inputs, hereinafter referred to as 21 and 21', and two outputs, hereinafter referred to as 39 and 39'. The amplifier 20 comprises three functional subcircuits 36, 38, 40. The subcircuit 36 is an overdrive transconductance stage, hereinafter referred to as overdrive stage 36. The subcircuit 38 is a linear transconductance stage, hereinafter referred to as linear stage 38, and the subcircuit 40 is a common-mode feedback stage, hereinafter referred to as common-mode stage 40. The subcircuits 36, 38 receive as an input the differential signals IN1, IN2 which together correspond to one of the signals (I, Q).

The overdrive stage 36 has ports 41, 43 which are connected directly to ports 35, 37 of the common-mode stage 40, respectively. The linear stage 38 has ports 31, 33 which are connected to the ports 41, 35, 43, 37, respectively. In FIG. 5, the capacitor C is connected between the ports 41, 31, 35 and 43, 33, 37 so that the capacitor C is associated with every stage 36, 38, 40, but also with the outputs 39, 39'. For descriptive purposes, the outputs 39, 39' are hereinafter considered to represent the ports 31, 41, 35, 43, 33, 37 and reference is only made to the outputs 39, 39'.

During a receive time slot, the amplifier 20 receives, via the input 21, a signal which is derived from the baseband signal and input to the signal processing module 7. The amplifier 20 uses this signal to generate currents which either charge the capacitor C or discharge the capacitor C depending on the magnitude and polarity of the DC offset. For instance, the overdrive stage 36 generates a charge current which is exemplary indicated as I4, and the linear stage 38 generates a charge current which is exemplary indicated as I5. Discharge currents are not shown in FIG. 5. These charge currents I4, I5 constitute a charge current, exemplary indicated as IC, which charges the capacitor C during the receive time slot.

Figure 10:
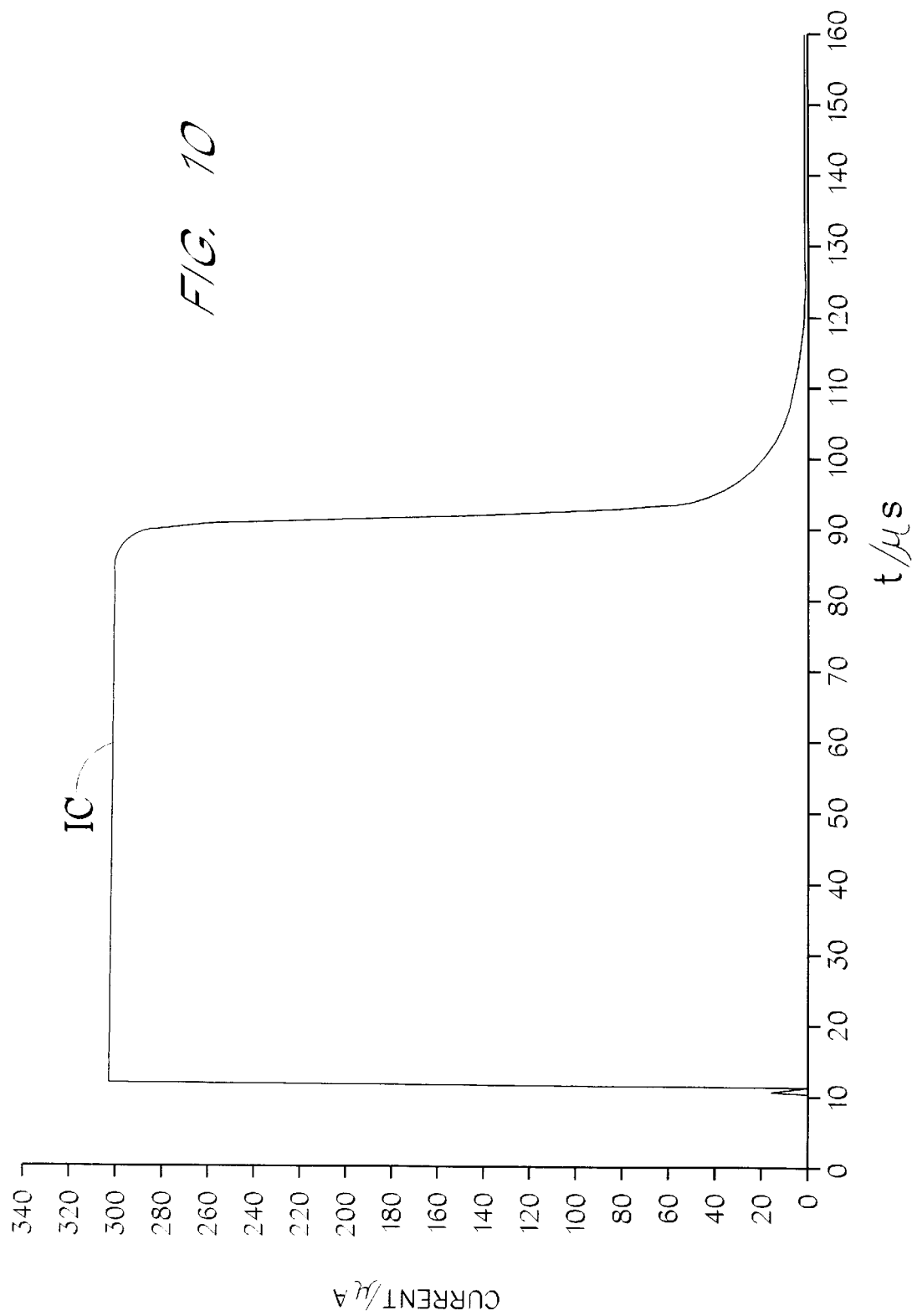
FIG. 10 is a graph illustrating a combined charge current as a function of time.

The charge of the capacitor C changes during the receive time slot, but remains constant during the transmit time slot. In one embodiment, the capacitor has a capacitance of about 68 nF and the charge current IC is, for example, about 300 microamperes ($\mu$A) as shown in FIG. 10. The charge current I4 provided by the overdrive stage 36 is higher than the charge current I5 provided by the linear stage 38.

Figure 11:
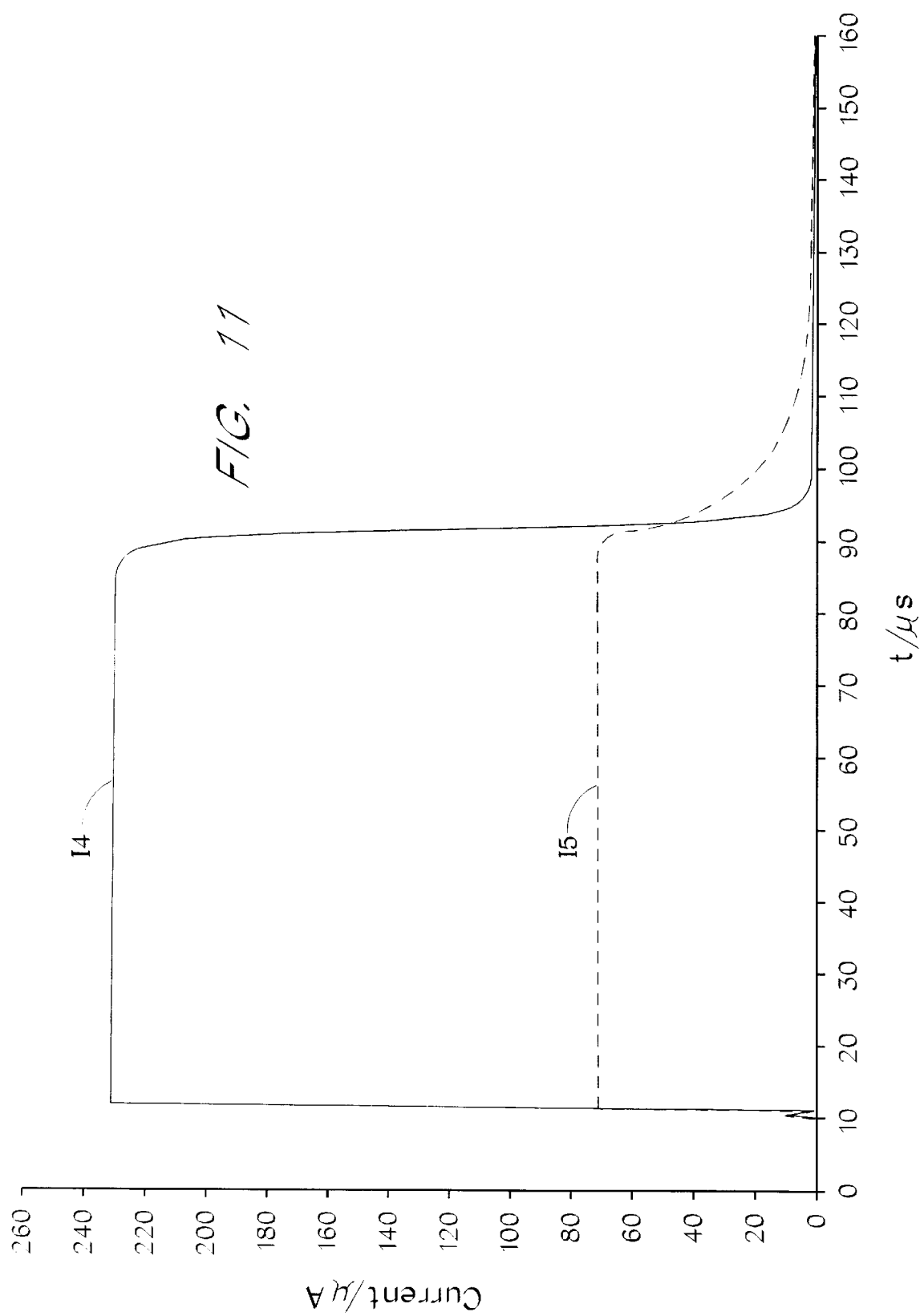
FIG. 11 is a graph illustrating individual charge currents as a function of time.

The higher charge current I4 provides for a faster response to correct a very large DC offset. The DC offset is, thus, more precisely tracked, advantageously resulting in an overall minimized settling time as explained below. For instance, the charge current I4 is about 230 $\mu$A, and the charge current I5 is about 70 $\mu$A as illustrated in FIG. 11.

The total gain of the feedback loop is ideally equal to unity, i.e., the gain equals 1 at the desired frequency, for example, of 20 kHz. The unity gain frequency depends upon the DC offset because the overdrive stage 36 influences the loop gain. When the DC offset increases the overdrive stage 36 increases the total loop gain and, therefore, the unity gain frequency increases also. In one embodiment, the maximal total loop gain is achieved for an DC offset of about 0.8 V. The maximum unity gain frequency should be kept below the cut-off frequency of the low-pass filter 16, for example, well below 650 kHz.

Figure 6:
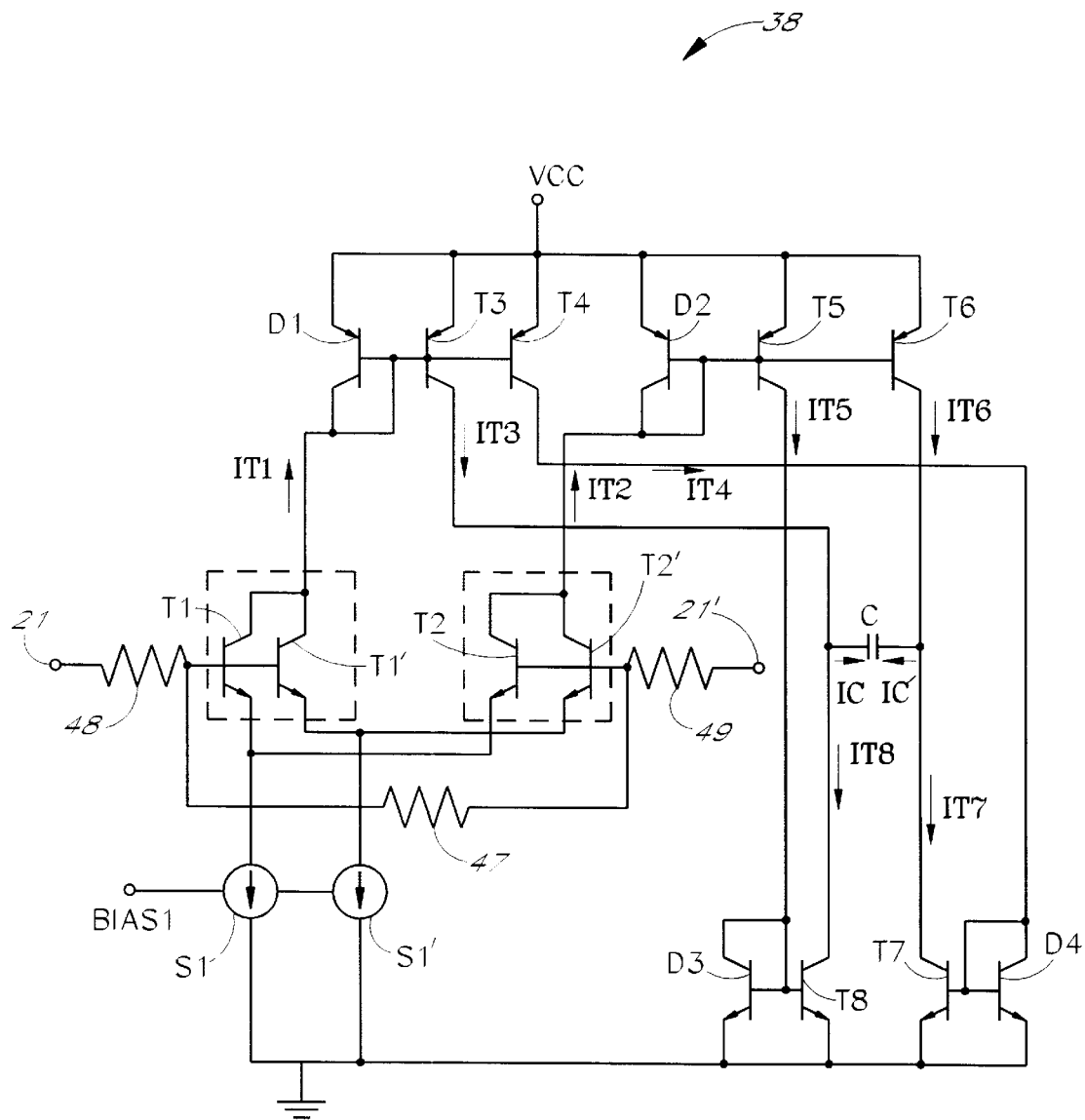
FIG. 6 is a simplified schematic of a first portion of the feedback circuit.

FIG. 6 shows a simplified embodiment of the linear stage 38. The linear stage 38 is connected to a supply voltage VCC and has the inputs 21, 21' and the outputs 39, 39' to which the (external) capacitor C is connected. As stated above, the linear stage 38 is part of an integrated circuit (chip) and comprises resistors 47–49, a plurality of npn and pnp transistors T1, T1', T2, T2', T3–T8, diodes D1–D4, and current sources S1, S1'. These transistors T1, T1', T2, T2', T3–T8, as well as the transistors described hereinafter each have a base, an emitter and a collector. The diodes D1–D4 are implemented through pnp (D1, D2) and npn (D3, D4) transistors, wherein the bases and the collectors are interconnected (shorted) so that one of the two pn junctions is shorted. It is contemplated that the diodes D1–D4 are exemplary implemented by means of shorted pnp or npn transistors which facilitates the process steps during manufacturing. While specific npn and pnp transistors are used in the illustrated embodiment, it is contemplated that the linear stage 38, as well as other circuits and sub-circuits described hereinafter, could be implemented by completely reversing the structure or by using other transistors.

The transistors T1, T2 form a first differential amplifier and the transistors T1', T2' form a second differential amplifier. The transistor T1 is connected in series with the grounded current source S1 and the (pnp transistor) diode D1 which is connected to the supply voltage VCC. The current source S1 and a current source S1' are controllable through a signal BIAS1 to each provide the same constant current. The base of the transistor T1 is connected to the resistor 48 which is further connected to the input 21. The collector of the transistor T1 is connected to the base of the (pnp transistor) diode D1 and the base of the pnp transistor T3. The emitter of the transistor T3 and the emitter of the diode D1 are connected to the supply voltage VCC. The emitter of the transistor T2 is connected to the current source S1 and the emitter of the transistor T1. The base of the transistor T2 is connected to the resistor 49 which is further connected to the input 21'. The base of the transistor T1 and the base of the transistor T2 are connected via the resistor 47.

The current source S1' is connected to the emitters of the transistors T1', T2'. The base of the transistor T1' is connected to the base of the transistor T1, and the base of the transistor T2' is connected to the base of the transistor T2.

The collector of the transistor T1 is connected to the diode D1, the base of the transistors T3, T4, and the collector of the transistor T2 is connected to the diode D2, the base of the transistors T5, T6. The transistors T3–T6 and the diodes D1, D2 are connected to the supply voltage VCC. The collector of the transistor T3 is connected to a first terminal of the capacitor C and the collector of the transistor T6 is connected to a second terminal of the capacitor C.

The signal BIAS1, as well as a signal BIAS2 described below, are derived from a conventional bias source which may be on-chip or off-chip. Depending on the specific requirements, the signals BIAS1, BIAS2 can be constant or varying over time. Those skilled in the art will appreciate that biasing a circuit can be achieved with a bias current or a bias voltage in a conventional manner to preset a circuit and to ensure operation of this circuit. Hereinafter, the signals BIAS1, BIAS2 are bias currents.

The differential amplifier formed by the transistors T1', T2' is, in combination with the current source S1', parallel to the differential amplifier formed by the transistors T1, T2 in combination with the current source S1. That is, the collectors and the bases of the transistors T1, T1' and T2, T2', respectively, and the emitters of the transistors T1', T2' are connected. The transistors T1, T1', T2, T2' form a doublet which has the advantage of being more linear than, for example, an arrangement formed by the transistors T1, T2 only. Within such a doublet, the sizes of the transistors T1, T1', T2, T2' are selected to have predetermined relationships. For instance, the size of the transistor T1 is four times bigger than the size of the transistor T2, and the size of the transistor T2' is four times bigger than the size of the transistor T1.

The constant current generated by the current source S1 is split between the transistors T1, T2. Similarly, the constant current generated by the current source S1' is split between the transistors T1', T2' to bias the transistors T1, T2, T1', T2'. The transistors T1, T1' each conduct a collector current which together form a current IT1. Similarly, the transistors T2, T2' each conduct a collector current which together form a current IT2.

The linear stage 38 operates in a push-pull manner with respect to charging and discharging the capacitor C. The differential amplifiers formed by the transistors T1, T2; T1', T2', respectively, receive the differential signal (voltage) at the inputs 21, 21'. When the voltage difference between the bases of the transistors T1, T2 and T1', T2' is zero, the currents IT1, IT2 are equal. The diode D1 and the transistors T3, T4, and the diode D2 and the transistors T5, T6 form two current mirrors which "mirror" the currents IT1, IT2 into currents IT3, IT4 and IT5, IT6, respectively, of predetermined values.

In one situation, the voltage difference is zero, and the currents IT1–IT6 have the same value. For instance, the currents IT4, IT5 of the same value flow through the diodes D4, D3, respectively. This means, the current IT4 is mirrored to a current IT7 of the same value because of the current mirror D4, T7. Further, the current IT5 is mirrored to a current IT8 of the same value because of the current mirror D3, T7. That is, the current IT8 through the transistor T8 is equal to the current IT3, and the current IT7 through the transistor T7 is equal to the current IT6 (IC=0, IC'=0). The charge already stored in the capacitor C remains constant as long as the voltage difference is zero, i.e., no charging or discharging occurs because no current flows to or from the capacitor C, i.e., no current IC, IC' flows to or from the capacitor C.

If the DC offset is higher than zero, the voltage difference between the bases of the transistors T1, T1' and T2, T2', respectively, is positive (i.e., the voltage at the base of the transistor T1 is higher than the voltage at the base of the transistor T2). In this case, the current IT1 is higher than the current IT2. As a result, the currents IT3, IT4 are higher than the currents IT5, IT6. The current IT5 through the diode D3, which is equal to the (lower) current IT2, determines the current IT8. That is, the charge current IC is the difference between the currents IT3 and IT8. Further, the (higher) current IT4 through the diode D4 determines the current IT7 which is now equal to the (higher) current IT4. Since the current IT7 is higher than the current IT4, a current (IC') flows from the capacitor C. The capacitor C is charged until a predetermined charge state (voltage) is achieved.

When the voltage difference is negative, the above described situation is reversed and the capacitor C is discharged.

Figure 7:
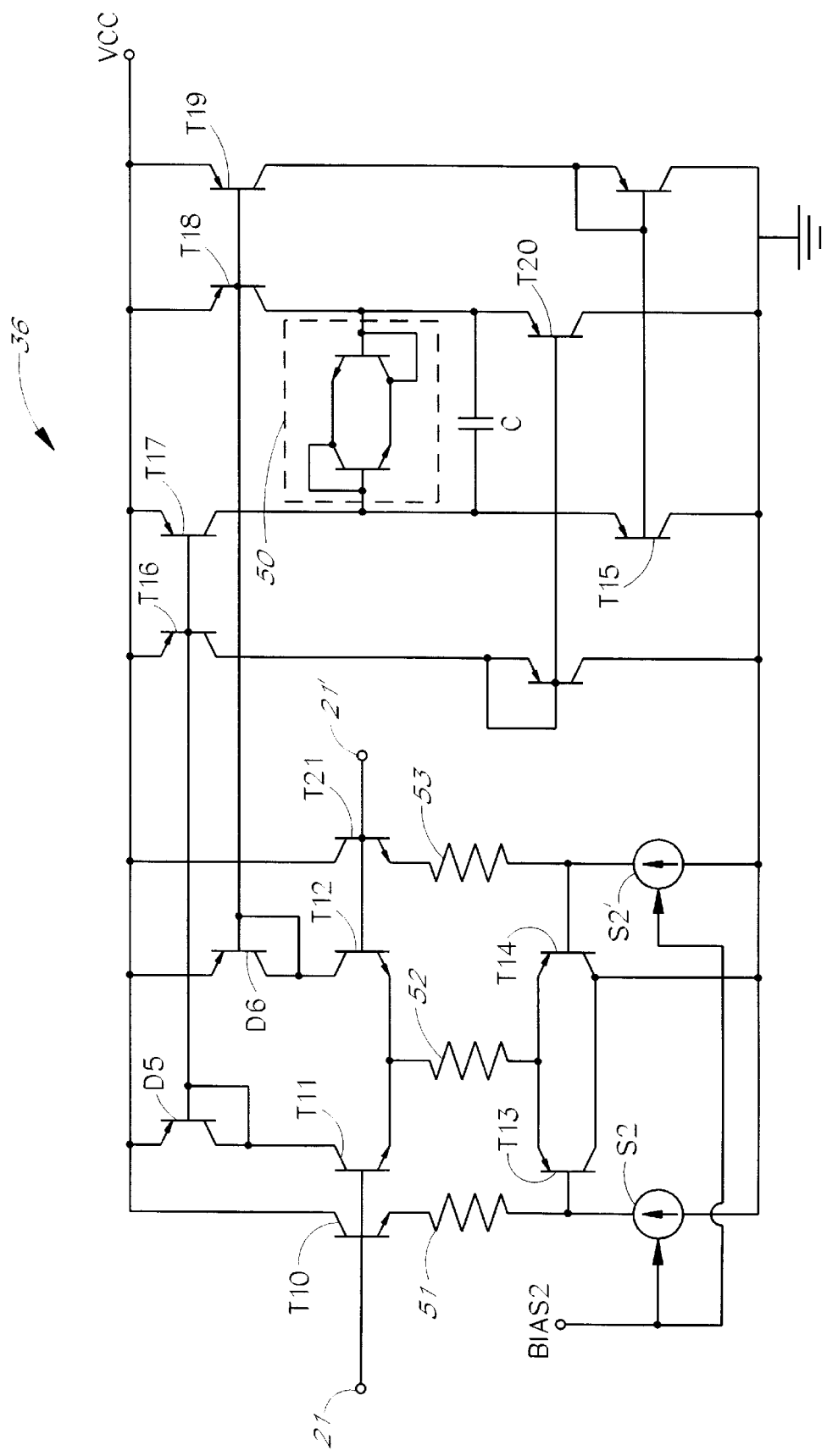
FIG. 7 is a simplified schematic of a second portion of the feedback circuit.

FIG. 7 shows a simplified embodiment of the overdrive stage 36. The overdrive stage 36 is also connected to the supply voltage VCC and is associated with the inputs 21, 21' and the capacitor C. The overdrive stage 36 operates also in the push-pull manner and has a differential input stage and a final stage for charging and discharging the capacitor C.

The differential input stage comprises in a first portion a serial arrangement of a npn transistor T10, a resistor 51 and a grounded current source S2 which is controlled by a signal BIAS2. The collector of the transistor T10 is connected to the supply voltage VCC, and the base of the transistor T10 is connected to the input 21. The resistor 51 is connected between the emitter of the transistor T10 and the current source S2. The base of a npn transistor T11 is also connected to the input 21, and the collector of the transistor T11 is connected to a (pnp transistor) diode D5. The diode D5 is connected to the supply voltage VCC and to bases of transistors T16, T17 of the final stage. The emitter of the transistor T11 is connected, via a resistor 52, to the emitter of a pnp transistor T13 and to the emitter of a pnp transistor T14. The base of the transistor T13 is connected to the current source S2 and the resistor 51, and the collector of the transistor T13 is grounded.

The differential input stage comprises a second portion which has a structure that is symmetric to the structure of the first portion described above. The serial arrangement of the second part includes a npn transistor T21, a resistor 53, and a current source S2'. The emitter of a npn transistor T12 is connected to the emitter of the transistor T11. The emitters of the transistors T13, T14 and the collectors of the transistors T13, T14 are interconnected. A connection to the final stage occurs via a diode D6 and pnp transistors T18, T19 similar to the subcircuit comprising the diode D5 and the transistors T16, T17, as described above.

The final stage has a structure that is similar to the structure, shown in FIG. 6, that charges and discharges the capacitor C. The final stage has an overload protection circuit 50 which is connected in parallel to the capacitor C. The overload protection circuit 50 is implemented through two anti-parallel (npn transistor) diodes. When the capacitor voltage exceeds a threshold voltage determined by the overload protection circuit 50, the overload protection circuit 50 prevents too high of a voltage from being applied to the capacitor C. Because the structure of the final stage is similar to the structure described in connection with FIG. 6, its operation is similar and reference is made to the above description of the operation of the final stage.

The differential input stage is configured to include a function of a threshold detector. The differential input stage is configured to determine a threshold value for the DC offset so that the overdrive stage 36 is active when the DC offset exceeds the threshold value. Thus, faster charging or discharging of the capacitor C occurs when the magnitude of the DC offset is above the threshold value. When the DC offset is below the threshold value the capacitor C is charged by circuit 38 only. The threshold value is determined at a given signal BIAS2 by the values of the resistors 51, 52, 53, but can be influenced by changing the signal BIAS2. In one embodiment, the values of the resistors 51, 53 are similar, for example 2.8 kohm, and differ from the value of the resistor 52. The current sources S2, S2' are both controlled by the signal BIAS2 and generate the same currents, for example 80 µA, and the voltage difference across the resistors 51, 53 is approximately 0.224 V.

During a receive time slot, the current sources S2, S2' are active and a voltage is applied to each of the inputs 21, 21', a current flows through the transistor T10 and the resistor 51, and a current flows through the transistor T21 and the resistor 53. The currents are set by the current sources S2, S2' via the signal BIAS2 which is a bias current. In each branch, the current causes a voltage across the resistor 51, 53 which is applied to the base of the pnp transistor T13, T14. Thus, the bases of the transistors T13, T14 are biased to approximately one base-emitter voltage plus 0.224 V below the input voltage 21, 21'.

The differential input stage is configured so that the transistors T13, T14 sense the magnitude of the input signal applied to the inputs 21, 21'. Only one of the transistors T13, T14 is conducting at a time. Which transistor T13, T14 conducts depends on the polarity of the input signal. In the illustrated embodiment, the transistors T13, T14 conduct when the base-emitter voltages reach a value of about 0.8 V. Similar to the transistors T13, T14, only one of the transistors T11, T12 conducts at a time. Which one conducts depends also on the polarity of the input signal. For instance, when the transistor T14 conducts a current flows through the resistor 52 and the conducting transistor T11. The polarity and magnitude of the DC offset determine the potential difference between the base of the transistor T14 and the input 21, or the potential difference between the base of the transistor T13 and the input 21'.

Figure 15:
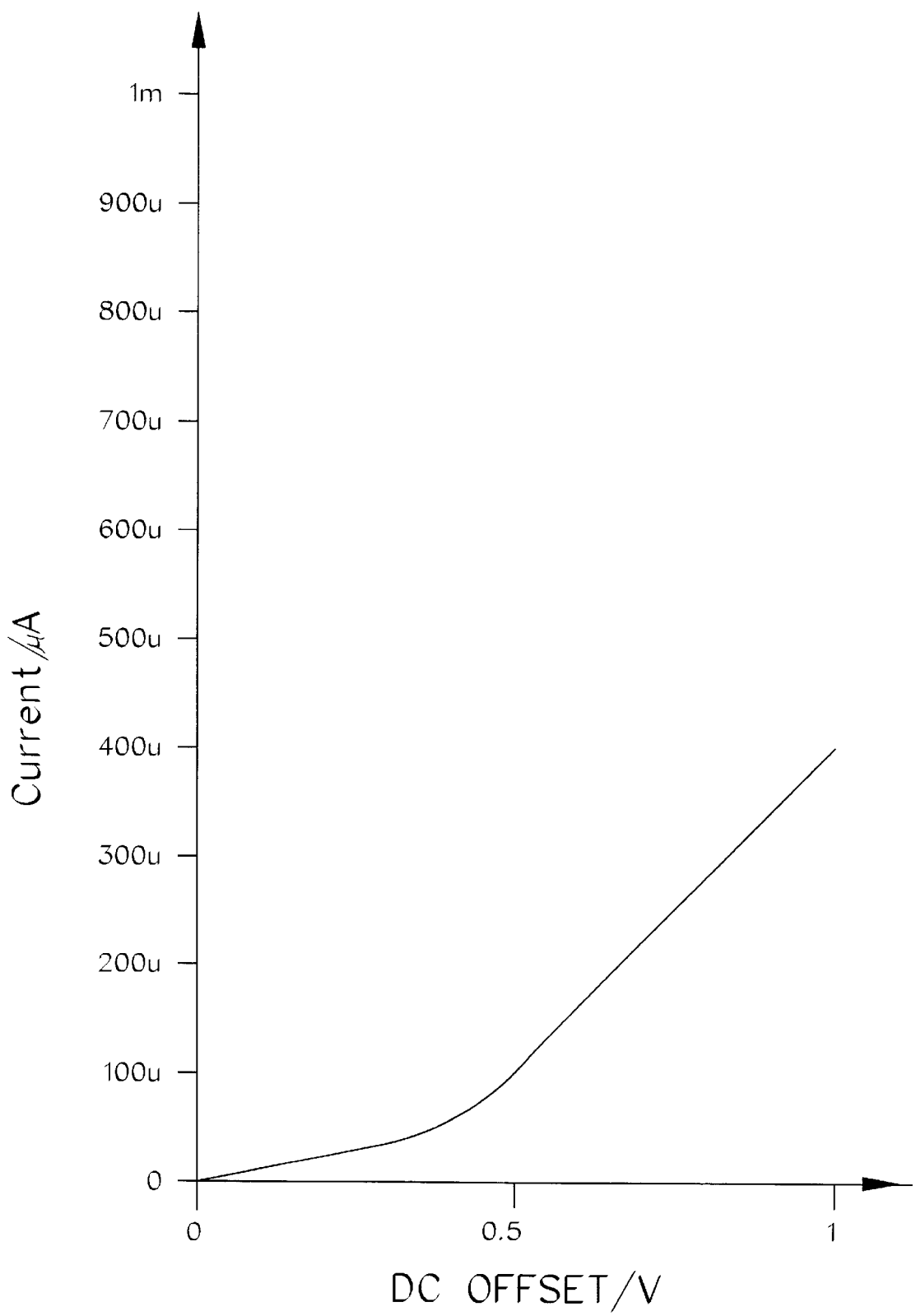
FIG. 15 is a graph illustrating a current as a function of an offset voltage.

The threshold value can be selected to activate the overdrive stage 36 at a DC offset magnitude greater than approximately 250 mV, as exemplary illustrated in FIG. 15. This activation is in one embodiment implemented by means of the combination of the resistors 51–53 and the transistors T13, T14. It is contemplated that other embodiments can implement the activation through separate threshold detection circuits, or exclusively by means of controlling the control signal BIAS2.

When the DC offset applied to the inputs 21, 21' is zero or below the threshold value, the transistors T11–T14 are not active so that no current flows through the resistor 52. Consequently, the charge of the capacitor C remains unchanged, except for the operation of the linear stage 38. For instance, until the voltage at the base of the transistor T13 is two base-emitter voltages lower than the voltage at the base of the transistor T21, or the voltages at the base of the transistor T14 is two base-emitter voltages lower than the voltage at the base of the transistor T10, neither of the transistors T13, 14 are conducting. The potential at the base of the transistor T13 follows the potential at the base of the transistor T10. Correspondingly, the potential at the base of the transistor T14 follows the potential at the base of the transistor T21.

When the DC offset increases above the threshold value, the collector of the transistor T11 conducts the current flowing through the resistor 52, or the transistor T12 conducts the current flowing through the resistor 52 depending on the polarity of the input signal at the inputs 21, 21'. For example, if the voltage at the input 21 is higher than the voltage at the input 21', and a voltage difference between the inputs 21, 21' increases beyond the threshold value, a current flows through the transistor T14, the resistor 52, and the transistor T11. The potentials at the bases of the transistors T13, T14 follow the potential at the inputs 21, 21', as explained above.

The current through the resistor 52 depends from the magnitude of the DC offset; the higher the DC offset, the higher the current through the resistor 52. The current through the resistor 52 flows either through the transistor T11 or the transistor T12 depending on the polarity of the input signal. For example, an increasing current through the transistor T11 causes a charge current that flows to the capacitor C. Because of the current mirrors T16, T17 and T18, T19, the current through the transistor T17 is higher than the current through the transistor T15, i.e., a current flows to the capacitor (via the "left" capacitor terminal.) Consequently, a current through the transistor T18 is lower than a current through the transistor T20, i.e., a current flows from the capacitor C (via the "right" capacitor terminal.)

As long as the DC offset is below the threshold value, no current flows through the resistor 52. As soon as the DC offset is above the threshold value, a current flows through the resistor 52 causing a current which modifies the charge of the capacitor C. The overdrive stage 36, thus, generates an additional current to charge the capacitor C at a faster rate.

The base-emitter voltage ($VB_E$) is a function of the temperature (T), i.e., $dVB_E/dT$ is unequal to zero, typically about $-2$ mV/° C. The transistors T13, T14 are, thus, subject to temperature influences which may affect the accuracy of the desired threshold value. To minimize any drift of the threshold value caused by the temperature dependency of the transistors T13, T14, the signal BIAS2 is controlled to cause an opposite temperature dependency to stabilize the threshold value. That is, when the threshold value increases due to a decreasing temperature, the signal BIAS2 causes a negative drift to counteract the increase of the threshold value. The signal BIAS2 is generated by a circuit shown in FIG. 8.

Figure 8:
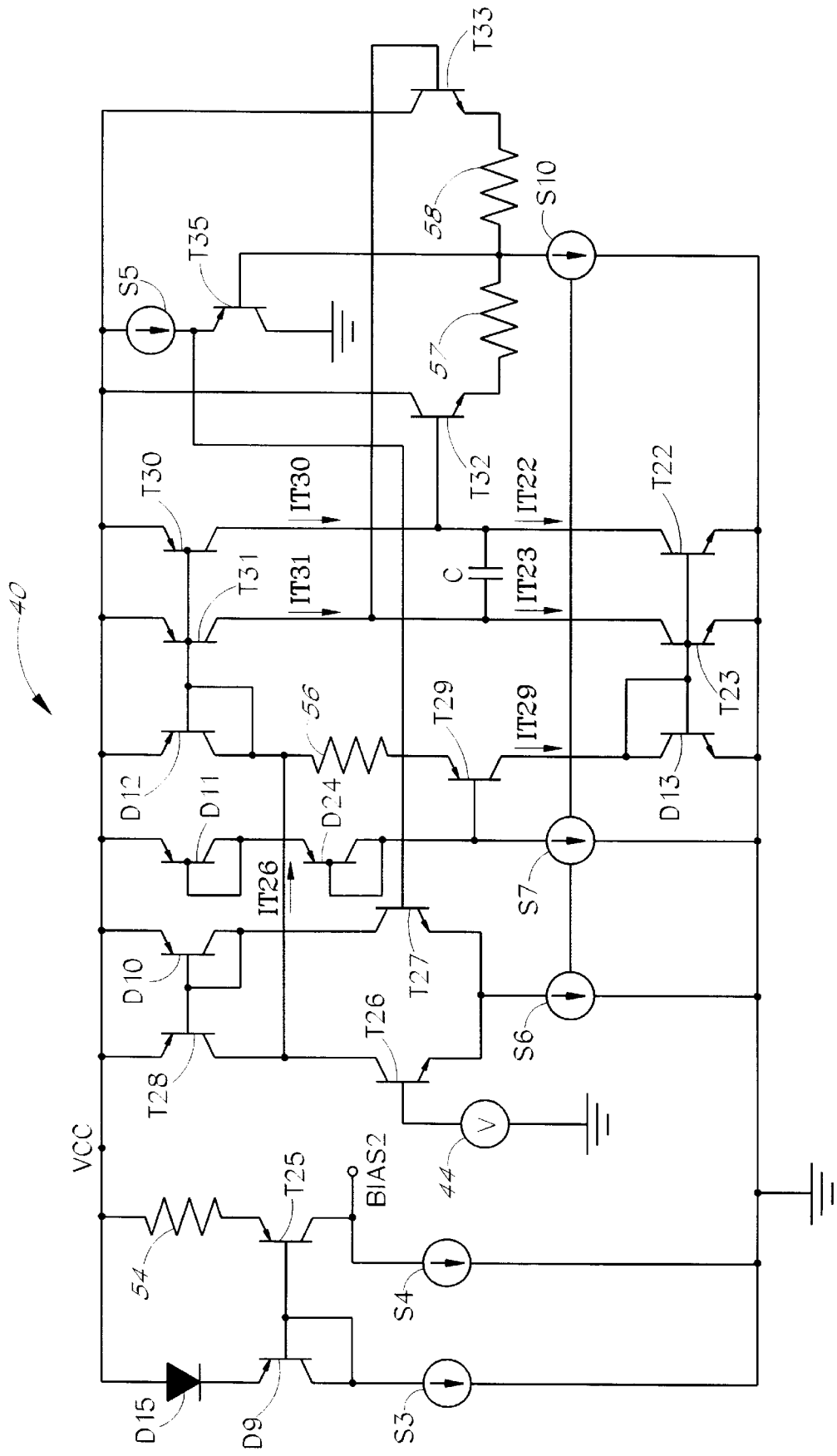
FIG. 8 is a simplified schematic of a third portion of the feedback circuit.

FIG. 8 shows one embodiment of the common-mode stage 40, which is shown in combination with a source for the signal BIAS2. The BIAS2 source comprises two parallel branches each having a grounded current source S3, S4. The current source S3 is serially connected with (pnp-transistor) diodes D9 and D15 which are connected to the supply voltage VCC. The current source S4 is serially connected with a pnp transistor T25 and a resistor 54 connected to the supply voltage VCC. The base of the transistor T25 is connected to the diode D9 and the current source S3. The signal BIAS2 is derived from the collector of the transistor T25. The collector of the transistor is connected to the current source S4.

The common-mode stage 40 comprises a differential amplifier formed by two npn transistors T26, T27. The emitters of these transistors T26, T27 are connected to a grounded current source S6. The collector of the transistor T26 is connected to the collector of a pnp transistor T28 whose emitter is connected to the supply voltage VCC, and the collector of the transistor T27 is connected to a (pnp transistor) diode D10. The diode D10 is connected to the supply voltage VCC and to the base of the transistor T28. The base of the transistor T26 is connected to a voltage source 44 which provides a reference voltage for the common-mode voltage. The base of the transistor T27 is connected to a circuit comprising a current source S5, a grounded pnp transistor T35, and a differential stage comprising two npn transistors T32, T33 and resistors 57, 58. The resistors 57, 58 are serially connected between the emitters of the transistors T32, T33. A connection between the resistors 57, 58 is connected to a grounded current source S10 and to the base of the transistor T35. The differential stage picks up the common-mode voltage at the capacitor C and feeds, via the transistor T35, the measured common-mode voltage to the base of the transistor T27. The differential amplifier (T26, T27) compares the measure common-mode voltage vith the reference voltage, and generates a difference signal indicative of the difference between the measured common-mode voltage and the reference voltage.

The collector of the transistor T26 is further connected to a resistor 56 and a (pnp transistor) diode D12 which is connected to the supply voltage VCC and to the base of a transistor T31. The resistor 56 is connected to a pnp transistor T29 which is connected to a grounded (npn transistor) diode D13. The base of the transistor T29 is connected to a grounded current source S7 and a serial arrangement of two (pnp transistor) diodes D11, D24. The diode D11 is connected to the diode D24 and the supply voltage VCC. The diode D13 is further connected to the bases of npn transistors T23, T22. The emitters of the transistors T23, T22 are grounded. The collector of the transistor T23 is connected to one of the terminals of the capacitor C, the collector of the transistor T31 and the base of the transistor T33. The collector of the transistor T22 is connected to the capacitor's other terminal, to the collector of a pnp transistor T30 and to the base of the transistor T32.

As discussed above, the circuit comprising the transistors T32, T33 picks up the common-mode voltage at the capacitor C. In one embodiment, if the base-emitter voltage of each of the transistors T32, T33 is higher than about 0.7 V, each transistor T32, T33 is conducting causing a current that is indicative of the potential at the respective terminal of the capacitor C. Both currents combined form a sum current that is indicative of the common-mode voltage at the capacitor C. The sum current influences the operation of the transistor T35 resulting in voltage changes at the emitter of the transistor T35. These voltage changes are fed to the base of the transistor T27. The dynamic difference between the reference voltage and the measured voltage determines a collector current IT26 of the transistor T26. A current mirror formed by the diode D12 and the transistors T30, T31 mirrors the collector current IT26 into collector currents IT30, IT31 of the transistors T30, T31 which are connected to the capacitor C. In this embodiment, the currents IT30, IT31 have approximately the same value.

A current mirror formed by the diode D13 and the transistors T22, T23 mirrors a collector current IT29 of the transistor T29 into collector currents IT22, IT23 of the transistors T22, T23. When the current IT29 is equal to the current IT30 and the current IT31, no current flows into the capacitor C because the currents IT22, IT23 are approximately the same as the currents IT30, IT31. As soon as this balance changes, i.e., the currents IT30, IT31 are not approximately the same as the currents IT22, IT23 current flows to or from the capacitor C whereby the common mode voltage is increased or decreased.

The common-mode stage 40 controls the potentials which are simultaneously present at both terminals of the capacitor C. For example, the potentials of both capacitor terminals can be simultaneously changed to maintain the optimal common-mode voltage of the overdrive 36 and the linear stage 38. As shown in FIGS. 3, 5 and 8, the common-mode voltage of the capacitor C can influence the operation of the feedback loop because the voltage of the capacitor C is an input signal to various subcircuits.

Figure 9:
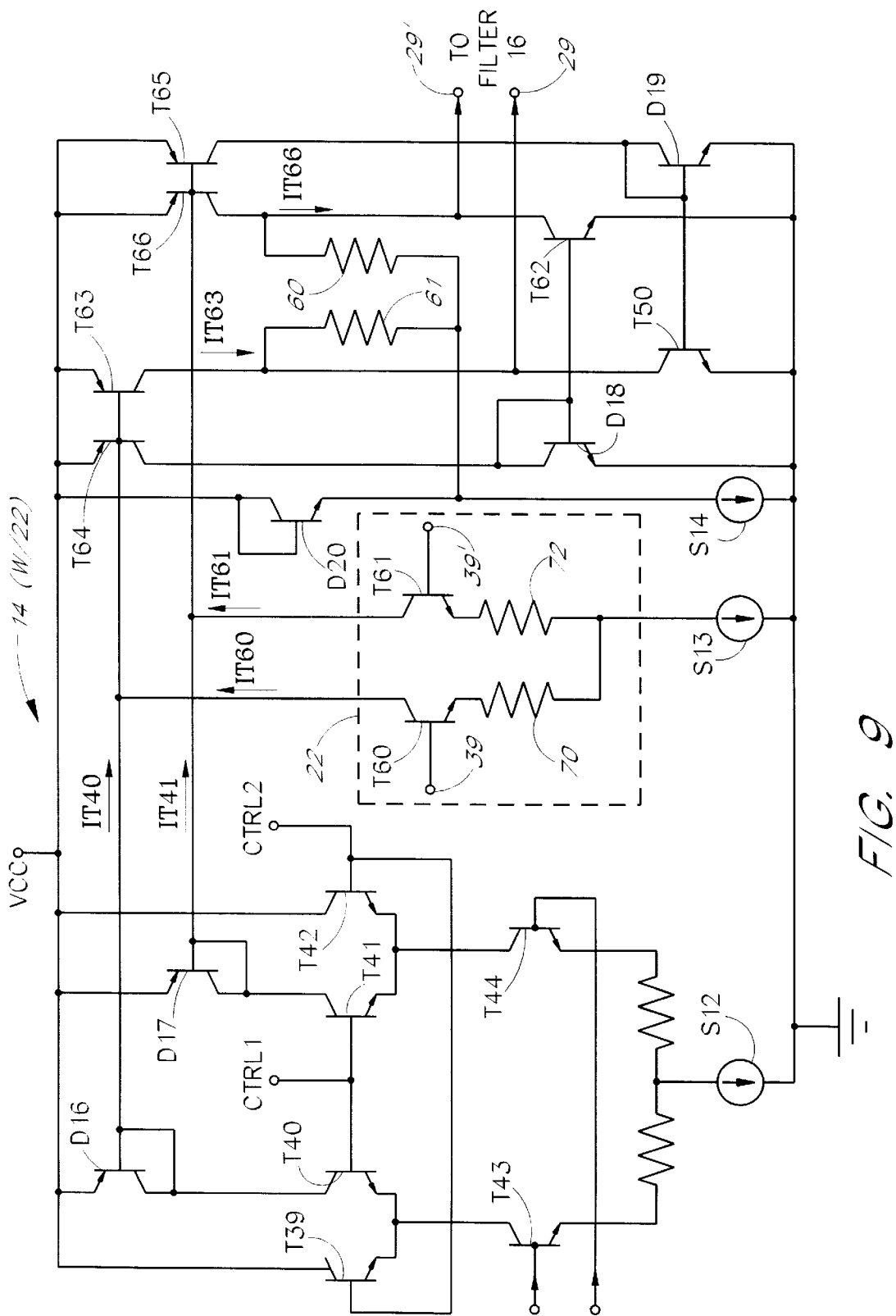
FIG. 9 is a simplified schematic of a controlled amplifier module.

FIG. 9 shows one embodiment of the amplifier 14 which includes the amplifier 22. With reference to FIG. 3, it is contemplated that the amplifier 14 is not part of the feedback path formed by the amplifiers 20, 22. It is further contemplated that the amplifier 14 can be a conventional amplifier typically used in RF receivers. In the illustrated embodiment, however, the amplifier 22 is combined with the amplifier 14 as shown in FIG. 9. Thus, the description of FIG. 9 is directed to the amplifier 22 and its combination with the amplifier 14.

The amplifier 22 includes two npn transistors T60, T61. A resistor 70 connects the emitter of the transistor T60 to a grounded current source S13. Similarly, a resistor 72 connects the transistor T61 to the current source S13. The base of the transistor T60 (input 39) and the base of the transistor T61 (input 39') are connected to the capacitor C (not shown in FIG. 9). The collector of the transistor T60 is connected to a first branch of a differential circuit connected to the mixer module 12 (not shown). The collector of the transistor T60 is further connected to a first branch of an output circuit connected to the filter 16. Similarly, the collector of the transistor T61 is connected to a second branch of the differential circuit and to a second branch of the output circuit.

The differential circuit comprises a differential stage formed by transistors T43, T44. The emitter of the transistor T43 is connected through a resistor 45 to a current source S12, and the emitter of the transistor T44 is connected through a resistor 46 to the current source S12. Each collector of the transistor T43, T44 is associated with a differential circuit formed by transistors T39, T40, T41, T42. The bases of the transistors T40, T41 are interconnected and connected to a line for a control signal CTRL1. The bases of the transistors T39, T42 are also interconnected and connected to a line for a control signal CTRL2. The control signals CTRL 1, CTRL 2 form the control signal AGC shown in FIG. 3. By means of the control signals CTRL1, CTRL2 the gain of the amplifier 14 can be controlled. That is, the control signals CTRL1, CTRL2 modify the proportion of the collector currents of the transistors T43, T44 that is passed to the output. The control signals CTRL1, CTRL2 are in one embodiment voltage signals generated by the central processor or a subprocessor of the phone 3.

The collector of the transistor T40 and the collector of the transistor T60 are connected, via a (pnp transistor) diode D16, to a to the bases of two pnp transistors T63, T64 which are part of a current mirror. Similarly, the collector of the transistor T41 and the collector of the transistor T61 are connected, via a (pnp transistor) diode D17, to the bases of two pnp transistors T65, T66 which are also part of a current mirror. The collector of the transistor T65 is connected to a grounded (npn transistor) diode D19 and to the base of a transistor T50. The emitter of the transistor T50 is connected to ground and the collector is connected to the resistor 61 and the collector of the transistor T64. The collector of the transistor T66 is connected to the collector of a npn transistor T62 whose emitter is connected to ground. The base of the transistor T62 is connected to a grounded (npn transistor) diode D18 and to the collector of the transistor T64. The emitter of the transistor T50 is connected to ground and the collector is connected to the resistor 61 and the collector of the transistor T64.

The collector of the transistor T63 is connected to the resistor 61 and the port 29 of the filter 16 (FIG. 3). The collector of the transistor T66 is connected to the resistor 60 and a port 29' of the filter 16. In FIG. 3, the ports 29, 29' are correspond to the port 29 of the filter 16 in the single-ended embodiment. The resistors 60, 61 are both connected to a grounded current source S14. The current source S14 is further connected to a (npn transistor) diode D20 which is connected to the voltage supply VCC.

The inputs 39, 39' of the amplifier 22 are connected to the capacitor C. When the capacitor C is not charged, a current equally flows through the transistors T60, T61, which are always active. That is, a collector current IT60 flowing through the transistor T60 has the same value as a collector current IT61 flowing through the transistor T61.

A collector current IT40 of the transistor T40 and the collector current IT60 of the transistor T60 are combined and input to the current mirror formed by the transistors T63, T64. The combined current is transformed into a current IT63 which causes a voltage across the resistor 61. This voltage is available at the output 29. Similarly, a collector current IT41 of the transistor T41 and the collector current IT61 of the transistor T61 are combined and mirrored to a current IT66. The current IT66 causes a voltage across the resistor 60 is output at the output 29'. In case the collector currents IT60, IT61 are equal, no difference voltage between the outputs 29, 20' exists.

The bases of the transistors T60, T61 are connected to the capacitor C which has a voltage that corresponds to the present DC offset. The DC offset, thus, determines the current IT60 which is added to the current IT40 to increase the current IT63. An increased current IT63 causes a higher voltage at the resistor 61 and consequently at the output 29.

The voltage of the capacitor C is therefore used to continuously compensate for the DC offset of the signal received from the mixer module 12.

FIGS. 10–14 schematically show graphs which illustrate the compensation of the DC offset within a predetermined settling time. Values shown in these figures are exemplary and serve to illustrate the principle characteristics of the amplifier module 17 for a given large DC offset. FIG. 10 is a graph illustrating the current IC (FIG. 5) in $\mu$A as a function of the time in microseconds ($\mu$s). In one embodiment of the amplifier module 17, the current IC has a maximal value of about +300 $\mu$A. It is contemplated that the sign of the current IC can be positive or negative depending on the specific implementation of the amplifier module 17.

In the illustrated embodiment, the current IC is turned on at about 10 $\mu$s at the start of a receive time slot. The current IC reaches its maximal value of about 300 $\mu$A with which the capacitor C is charged for about 90 $\mu$s. After this time the current IC returns to zero within about 30–40 $\mu$s.

FIG. 11 is a graph illustrating the currents I4, I5 as functions of time. The currents I4, I5 form the current IC (FIG. 10) that charges the capacitor C. In one embodiment, the current I4 is about 230 $\mu$A and the current I5 is about 70 $\mu$A so that the combined current IC is about 300 $\mu$A.

Figure 12:
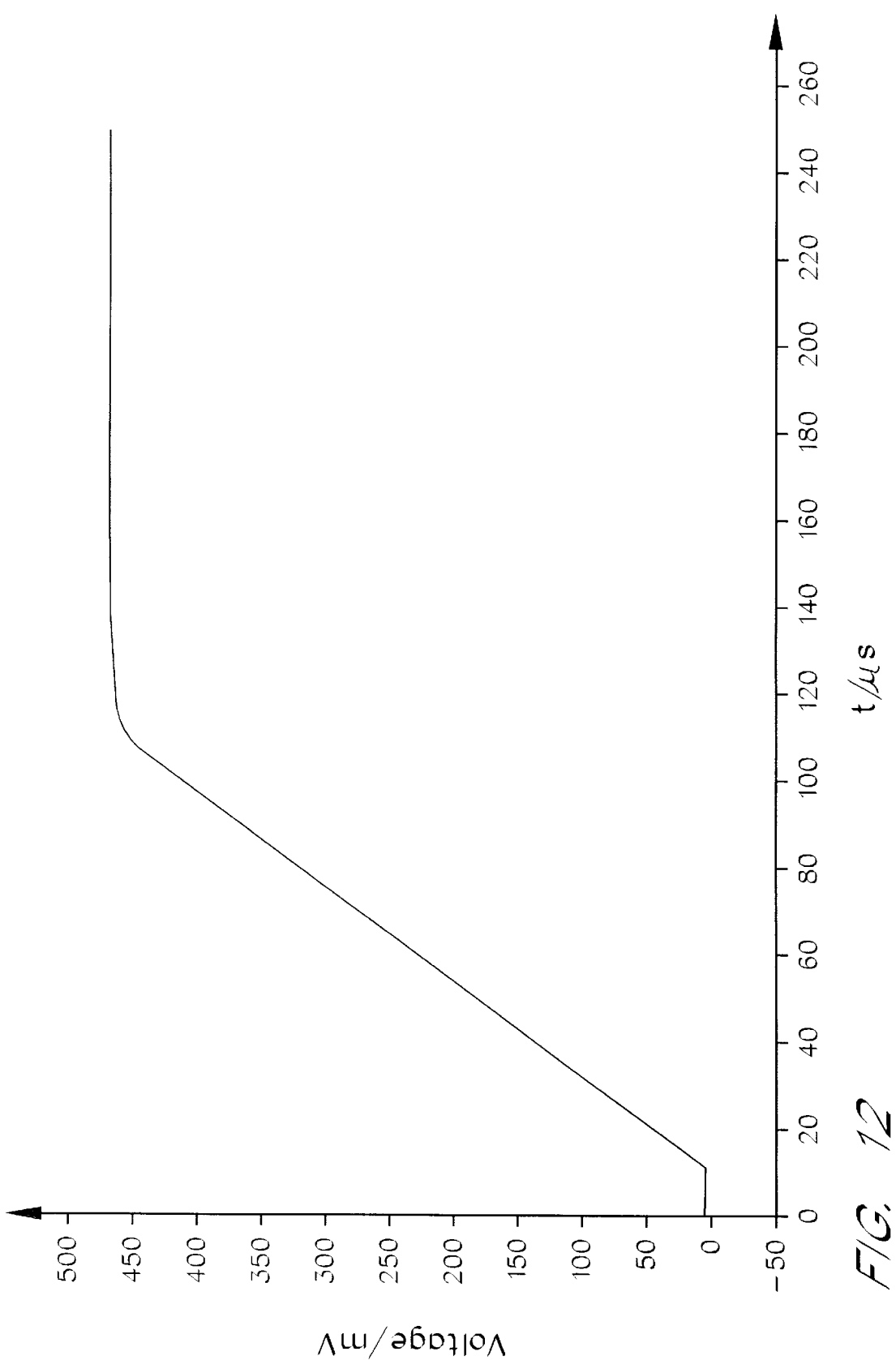
FIG. 12 is a graph illustrating a voltage across a capacitor as a function of time.

FIG. 12 is a graph illustrating a voltage at the capacitor C as a function of time. The graph shows the voltage within a range of 0–500 mV. The capacitor voltage changes as a function of the charge current IC. The receive time slot starts at about 10 $\mu$s and the voltage increases linearly until charging stops after about 90 $\mu$s. The capacitor C maintains a voltage of about 450 mV after charging has stopped.

Figure 13:
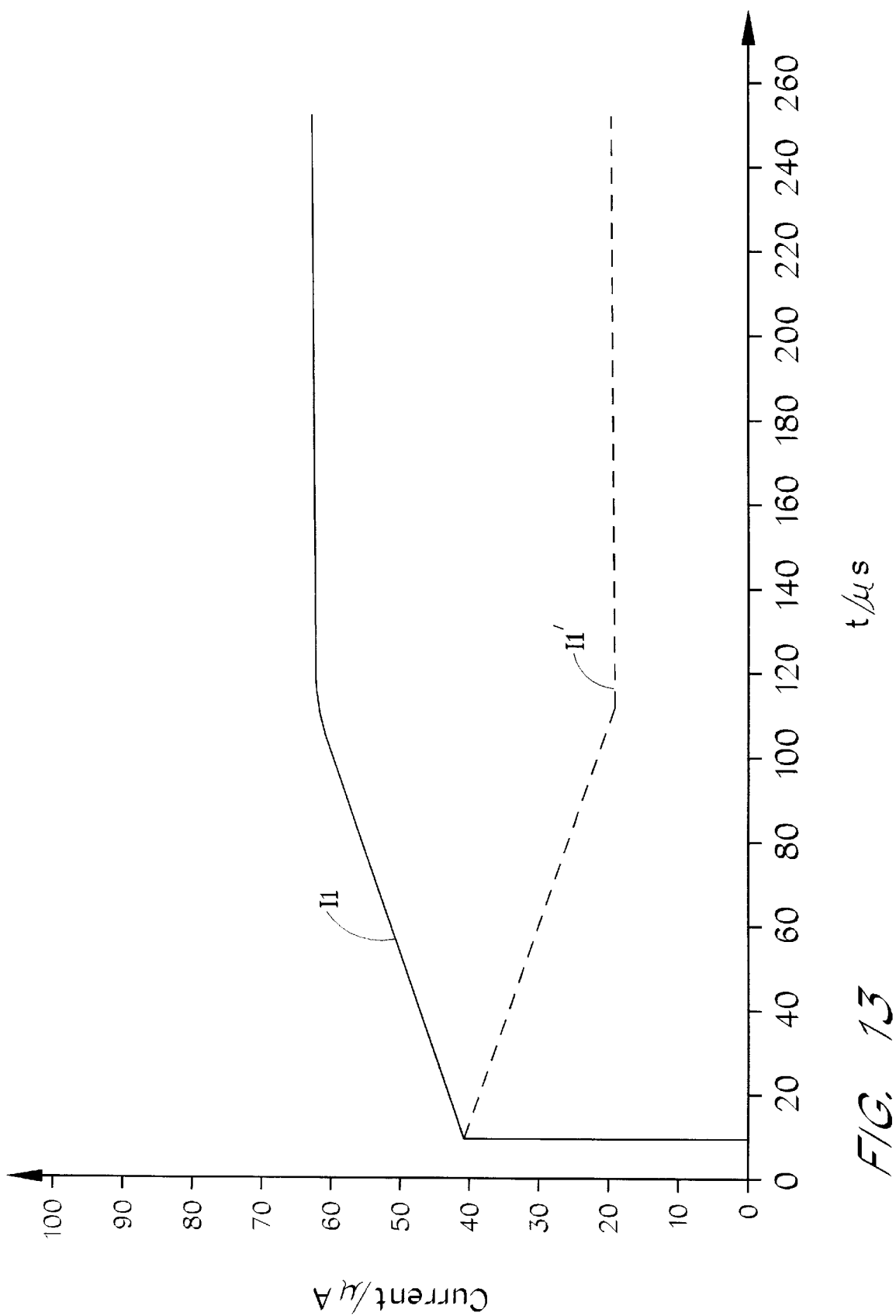
FIG. 13 is a graph illustrating compensation currents as a function of time.

FIG. 13 is a graph illustrating the currents I1, I1' as a function of time. As shown in FIG. 3, the current I1 is the output current from the amplifier 22. An exemplary current I1 is shown as linearly increasing from about 40 $\mu$A to about 60 $\mu$A. The current I1' linearly decreases from about 40 $\mu$A to about 20 $\mu$A. The sum of the currents I1, I1' is constant, for example, about 80 $\mu$A set by the current source 13. The difference current (I1–I1') compensates for the DC offset.

Figure 14:
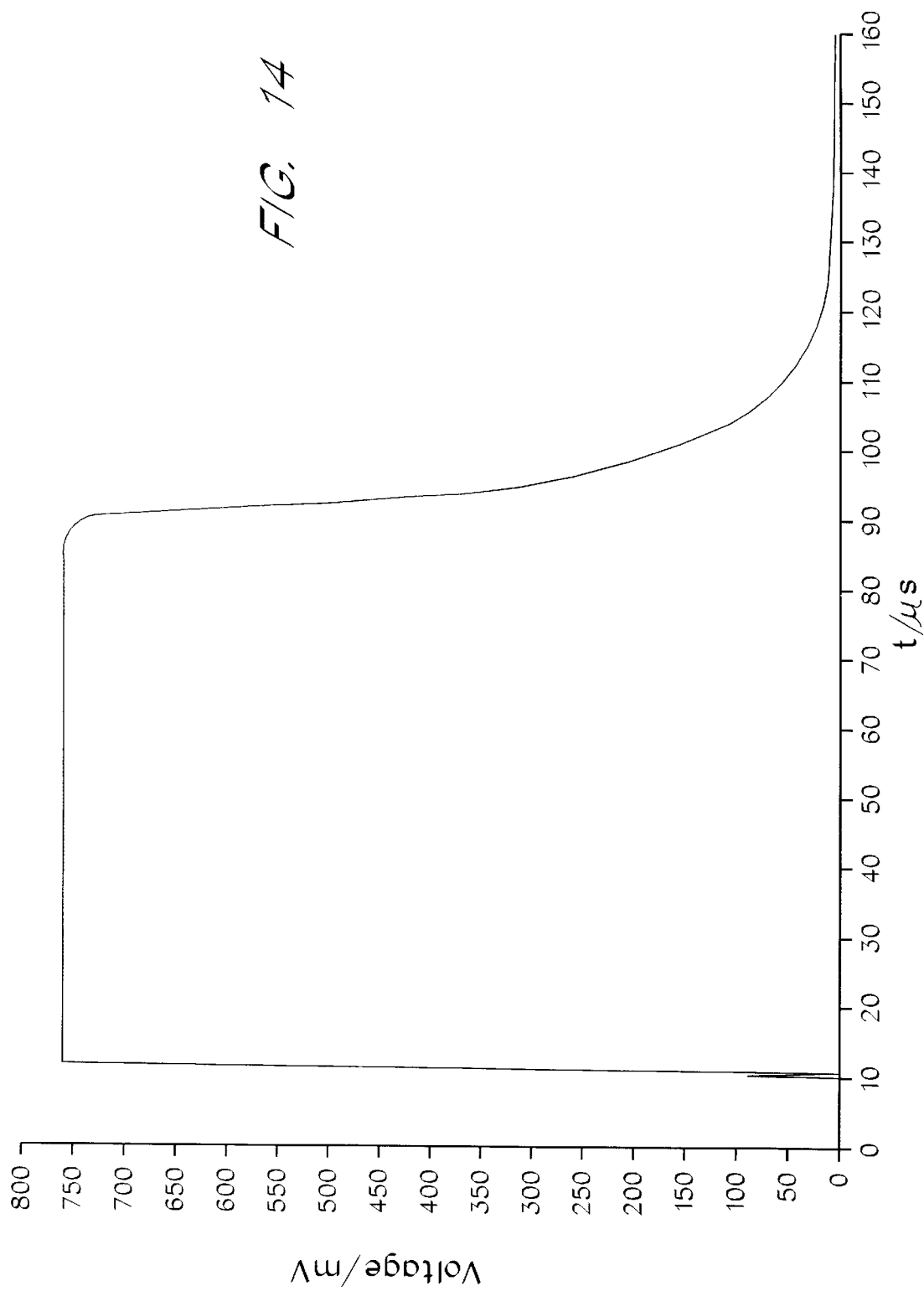
FIG. 14 is a graph illustrating a voltage of an amplifier as a function of time.

FIG. 14 is a graph illustrating a voltage in mV as a function of the time in $\mu$s. This graph represents the voltage at the output of the amplifier 18 shown in FIG. 3. As in the previous figures, the receive time slot starts at about 10 $\mu$s and the amplifier 18 is immediately saturated at a maximal voltage of about 760 mV. This saturation remains for about 80 $\mu$s, until a time of about 90 $\mu$s. Then the DC offset reduces rapidly to a low level. The DC offset is compensated to an acceptable level (less than about 20 mV) within about 115 $\mu$s after the start of a receive time slot. With reference to FIG. 11, it can be seen that while the output of the amplifier 18 is saturated, the current I4 flows to charge the capacitor C in tandem with the current I5. The current I4 effectively increases the servo loop gain and, hence, the servo loop bandwidth for a faster offset correction. As the output of the amplifier 18 comes out of saturation at a time of about 90 $\mu$s, the current I4 rapidly reduces to zero and the final charging of the capacitor C is completed by the current I5, and the loop bandwidth is reduced to its normal operational value (20 kHz) as explained above.

FIG. 15 is a graph illustrating the current IC in $\mu$A as a function of the DC offset between 0 and about 1 V. As shown in FIG. 5, the linear stage 38 generates the current I5 which, which, when the overdrive stage 36 is active, is added to the current I4 generated by the overdrive stage 36 to form the charge current IC. The graph of the current IC begins at about 0 $\mu$A and increases linearly with an increasing DC offset. At a DC offset of about 300 mV the current IC increases disproportionately. This disproportionate increase is caused by the overdrive stage 36 which generates the current I4 as soon as the DC offset exceeds the threshold value determined by the resistors 51–53. Both the current I4 and the current I5 increase with the increasing DC offset. Thus, at a DC offset above about 500 mV the current IC increases at a slope which is significantly greater than the slope of the current I5 alone. As described above, the additional current I4 provides for faster charging of the capacitor C.

The amplifiers 20, 22 in combination with the capacitor C have a finite delay to null-out the DC offset output from the mixer module 12. After initial power-up or whenever the receiver 1 is enabled, the amplifier 20 will charge the capacitor C to a voltage sufficient to produce enough correction current to null the DC offset at the baseband output. The charging time depends on the capacitance and the charging current which is related to the transconductance. The overdrive stage 36 increases the transconductance for large offset values.

The allowable settling time from power-up is several hundred microseconds, but the desired settling time from receive enable during each receive frame in the TDD sequence is preferably lower than 100 µs. However, in this case the capacitor C has a high impedance during transmit frames so that there is little discharge during the transmit time frame. The capacitor C holds the charge so that at the beginning of the next receive time slot the last DC offset is available. Although the DC offset may have changed, the stored DC value is likely to be close to the new DC offset.

As discussed above, a direct-conversion receiver in a radio communications system is configured to have a varying gain in order to track the varying signal strength of the received RF signal. Because of this varying gain, the amount of the DC offset at the output of the mixer is constantly changing. One aspect of the invention allows tracking of the DC offset and compensation or cancellation of the DC offset within a settling time of lower than about 100 µs.

This fast cancellation of the DC offset is desired to receive good data as soon as possible. Particularly for radio communications systems that operate in time division duplex (TDD), the faster the DC offset can be corrected, the higher the TDD transmission rate. A high TDD transmission rate is desired, for example, because a high TDD rate improves voice quality in cellular phones by reducing the delay or echo that is typically canceled.

While the above detailed description has shown, described and identified several novel features of the invention as applied to different embodiments, it will be understood that various omissions, substitutions and changes in the form and details of the described embodiments may be made by those skilled in the art without departing from the spirit of the invention. Accordingly, the scope of the invention should not be limited to the foregoing discussion, but should be defined by the appended claims.

What is claimed is:

1. A hand-held direct-conversion receiver for a radio frequency (RF) signal, the receiver receiving the RF signal dulling time slots in a time division duplex system, the receiver comprising:

a first input configured to receive the RF signal;

a first output configured to output a baseband signal derived from the RF signal;

a mixer module configured to receive the RF signal and a local signal generated by a local oscillator and to generate an intermediate signal which includes the baseband signal and an offset component; and an amplifier module connected between the first output and the mixer module, the amplifier module comprising a feedback loop which includes in a backward path a track-and-hold circuit, the track-and-hold circuit configured to track the offset component during a first time slot for reception, to hold a value of the offset component at an end of the first time slot until a subsequent second time slot begins, and to apply the value during the second time slot to the intermediate signal in order to provide for fast compensation of the offset component, wherein the track-and-hold circuit comprises a first amplifier stage having a second input which is associated with the first output to receive a signal derived from the baseband signal, a second amplifier stage having a third input, and a capacitor interposed between the first and second amplifier stages, and wherein the first amplifier stage includes a first subcircuit and a second subcircuit connected in parallel to the capacitor and the second input, the first subcircuit configured to linearly modify a charge of the capacitor based on the value of the offset component, and the second subcircuit configured to non-linearly modify the charge of the capacitor based on the value of the offset component.

2. The device of claim 1, further comprising a third subcircuit connected to the capacitor, the third subcircuit configured to modify a common mode voltage of the capacitor.

3. The device of claim 2, wherein the capacitor has a value of about 68 nF.

4. The device of claim 3, wherein the feedback loop has a unity gain frequency of about 20 kHz.

5. The device of claim 2, wherein the capacitor has a value of about 100 nF.

6. The device of claim 5, wherein the feedback loop has a unity gain frequency of about 14.5 kHz.

7. The device of claim 1, wherein the second subcircuit includes a threshold detector and a transistor circuit, the threshold detector being biased to a desired threshold value and associated with the transistor circuit which receives the output signal, and wherein the threshold detector activates the transistor circuit when the offset component of the output signal exceeds the threshold value.

8. The device of claim 7, wherein the threshold detector is configured to receive a control signal determining the threshold value.

9. The device of claim 8, wherein the control signal is a bias current adjustable to compensate for a temperature induced variation of the threshold value.

10. The device of claim 7, wherein the first subcircuit generates a first charge current, wherein the second subcircuit generates a second charge current when the offset component of the output signal exceeds the threshold value, and wherein the second charge current is added to the first charge current to form a sum current fed to the capacitor.

11. The device of claim 1, wherein the amplifier module further includes a forward path comprising a serial arrangement of a controllable amplifier, a filter and a final amplifier, the controllable amplifier configured to amplify the output signal and to input it to the filter which blocks frequencies above a predetermined cut-off frequency.

12. An electrical circuit comprising:

a first input for receiving a communications signal comprising a baseband and an offset component; and an amplifier module in communication with the first input, the amplifier module comprising a feedback loop with a track-and-hold circuit, the track-and-hold circuit configured to hold a compensation value, the track-and-hold circuit further configured to compensate the offset component based on the compensation value, wherein the track-and-hold circuit comprises a first amplifier stage having a second input which is configured to receive a signal derived from the baseband signal, wherein a second amplifier stage has a third input, wherein a capacitor is interposed between the first and second amplifier stages, and wherein the first amplifier stage includes a first subcircuit and a second subcircuit connected in parallel to the capacitor and the second input, the first subcircuit configured to linearly modify a charge of the capacitor based on the value representing the offset component, and the second subcircuit configured to non-linearly modify the charge of the capacitor based on the value of the offset component.

13. The circuit of claim 12, further comprising a third subcircuit connected to the capacitor, the third subcircuit configured to modify a common mode voltage of the capacitor.

14. The circuit of claim 12, wherein the second subcircuit includes a threshold detector and a transistor circuit, the threshold detector being biased to a desired threshold value and associated with the transistor circuit which receives the output signal, and wherein the threshold detector activates the transistor circuit when the offset component of the output signal exceeds the threshold value.

15. The circuit of claim 14, wherein the threshold detector is configured to receive a control signal determining the threshold value.

16. The circuit of claim 15, wherein the control signal is a bias current adjustable to compensate for a temperature induced variation of the threshold value.

17. The circuit of claim 14, wherein the first subcircuit generates a first charge current, wherein the second subcircuit generates a second charge current when the offset component of the output signal exceeds the threshold value, and wherein the second charge current is added to the first charge current to form a sum current fed to the capacitor.

18. The circuit of claim 12, wherein the amplifier module further includes a forward path comprising a serial arrangement of a controllable amplifier, a filter and a final amplifier, the controllable amplifier configured to amplify the output signal and to input it to the filter which blocks frequencies above a predetermined cut-off frequency.

19. The circuit of claim 18, wherein the controllable amplifier comprises the second amplifier, an input circuit of the controllable amplifier converting the output signal to a signal current and the second amplifier converting a voltage at the capacitor to a compensation current, the compensation current being added to the signal current to compensate for the offset component.

20. The circuit of claim 19, wherein the controllable amplifier further comprises an output circuit configured to receive the signal current and the compensation current, and to the signal current and the compensation current to a voltage.

21. A method for compensating an offset component comprising:
receiving a communications signal comprising a baseband and an offset component;
holding in a feedback path during at least a first time period, a compensation value;
compensating during at least a second time period, the offset component based on the compensation value; and
linearily modifying the compensation value during the first time period.

22. A method for compensating an offset component comprising:
receiving a communications signal comprising a baseband and an offset component;
holding in a feedback path during at least a first time period, a compensation value;
compensating during at least a second time period, the offset component based on the compensation value; and
non-linearly modifying the compensation value during the first time period.

23. A method for compensating an offset component comprising:
receiving a communications signal comprising a baseband and an offset component;
holding in a feedback path during at least a first time period, a compensation value; wherein the act of holding modifies a common-mode voltage of a capacitor existing in the feedback path; and
compensating during at cast a second time period, the offset component based on the compensation value.

24. An electrical circuit comprising:
a first input for receiving a communications signal comprising a baseband and an offset component; and
an amplifier module in communication with the first input, the amplifier module comprising:
a feedback loop;
a track-and-hold circuit within a feedback path of the feedback loop, the track-and-hold circuit having at least one capacitance which stores a voltage related to the offset component, the track-and-hold circuit further configured to output a compensation drive signal, wherein the track-and-hold circuit comprises a drive circuit which generates a first drive signal, the first drive signal configured to modify the voltage stored on the capacitance, wherein the drive circuit is further configured to generate a second drive signal when the offset component exceeds a predetermined threshold value; and
a compensation circuit which compensates the offset component by combining the offset component with the compensation drive signal.

25. The electrical circuit of claim 24, wherein the first and second drive signals modify the voltage stored on the capacitance, and wherein the second drive current is higher than the first drive current.

26. A method for compensating an offset component of a baseband signal comprising:
receiving a baseband signal with an offset component;
coupling the baseband signal to a feedback path;
generating a first drive signal to modify a voltage across a capacitor in the feedback path, the first drive signal and the voltage across the capacitor being substantially dependent on the offset component;
generating a compensation signal which is based on the voltage across the capacitor;
combining the compensation signal with the baseband signal to substantially compensate the offset component; and
generating a second drive signal when the offset component has a value which is above a predetermined threshold value.

27. The method of claim 26, wherein the first and second drive signals are drive currents modifying the charge of the capacitor, and wherein the second drive current is higher than the first drive current.

* * * * *